(12) United States Patent  
Wu

(10) Patent No.: US 7,936,040 B2
(45) Date of Patent: May 3, 2011

(54) SCHOTTKY BARRIER QUANTUM WELL RESONANT TUNNELING TRANSISTOR

(75) Inventor: Koucheng Wu, Fremont, CA (US)

(73) Assignee: Koucheng Wu, Hsingchu (TW)

( * ) Notice: Subject to any disclaimer, the term of this patent is extended or adjusted under 35 U.S.C. 154(b) by 319 days.

(21) Appl. No.: 12/258,425

(22) Filed: Oct. 26, 2008

(65) Prior Publication Data

US 2010/0102298 A1 Apr. 29, 2010

(51) Int. Cl.
*H01L 29/47* (2006.01)
(52) U.S. Cl. .................. 257/474; 257/E29.178
(58) Field of Classification Search .......... 257/471–486, 257/E29.178
See application file for complete search history.

(56) References Cited

U.S. PATENT DOCUMENTS

| | | | |
|---|---|---|---|
| 4,477,308 A | 10/1984 | Gibson | |
| 4,495,511 A * | 1/1985 | Yoder | 257/264 |
| 5,040,034 A | 8/1991 | Murakami et al. | |
| 5,049,953 A | 9/1991 | Mihara et al. | |
| 5,663,584 A | 9/1997 | Welch | |
| 5,962,893 A | 10/1999 | Omura et al. | |
| 6,303,479 B1 | 10/2001 | Snyder | |
| 6,353,251 B1 | 3/2002 | Kimura | |
| 6,963,121 B2 * | 11/2005 | Wu | 257/471 |

* cited by examiner

*Primary Examiner* — Minh-Loan T Tran
*Assistant Examiner* — Kevin Quinto
(74) *Attorney, Agent, or Firm* — SV Patent Service

(57) ABSTRACT

A semiconductor transistor device includes one or more conductive base regions, a first semiconductor barrier region, a second semiconductor barrier region, a conductive emitter region, and a conductive collector region. The first semiconductor barrier region or the second semiconductor barrier region has a dimension smaller than 100 Å. A first Schottky barrier junction is formed at the interface of the first semiconductor barrier region and the one or more conductive base regions. A second Schottky barrier junction is formed at the interface of the second semiconductor barrier region and the one or more conductive base regions. A third Schottky barrier junction is formed at the interface of the conductive emitter region and the first semiconductor barrier region. A fourth Schottky barrier junction is formed at the interface of the conductive collector region and the second semiconductor barrier region.

25 Claims, 18 Drawing Sheets

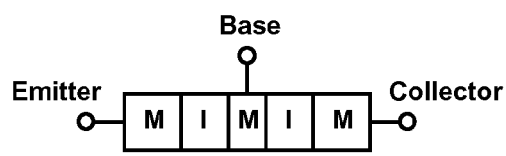
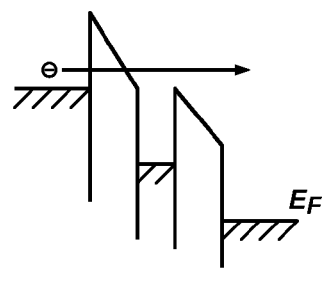
FIG. 1a (Prior Art)
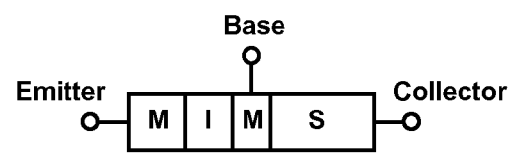
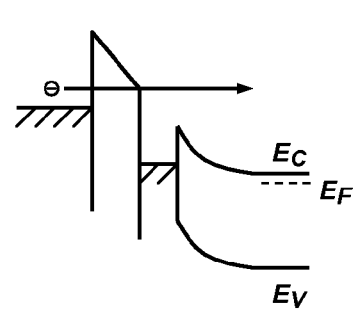
FIG. 1b (Prior Art)
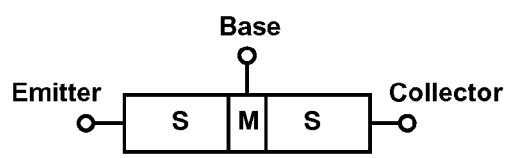
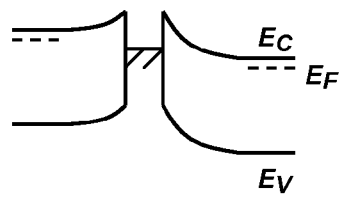
FIG. 1c (Prior Art)

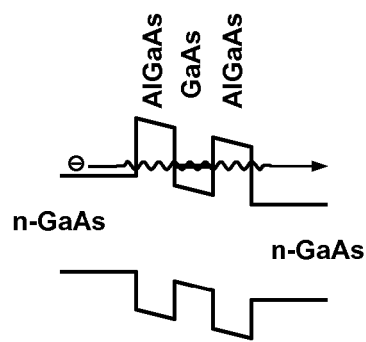
FIG. 2a *(Prior Art)*
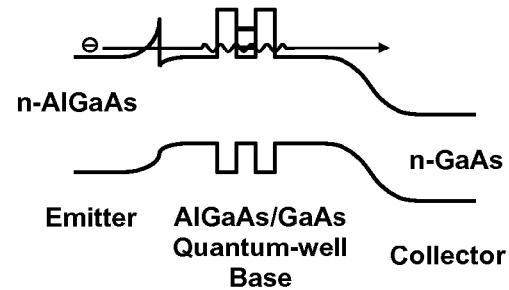
FIG. 2b *(Prior Art)*
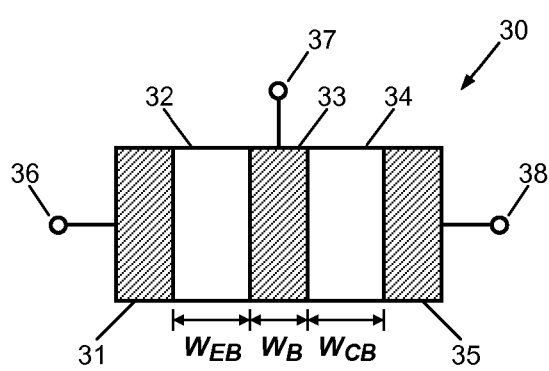
FIG. 3
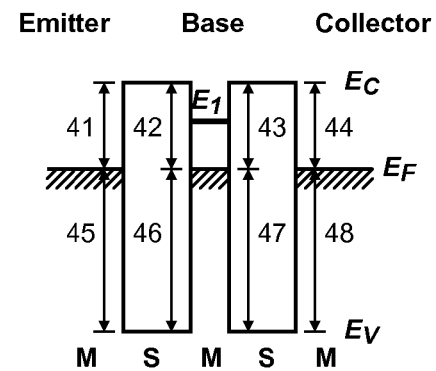
FIG. 4a

SCHOTTKY BARRIER QUANTUM WELL RESONANT TUNNELING TRANSISTOR

TECHNICAL FIELD

This application relates to a semiconductor device, specifically, a semiconductor transistor device suitable for analog and digital circuits.

BACKGROUND OF THE INVENTION

In the past four decades, the integrated circuit industry has followed a dramatic path of shrinking device dimensions and increasing chip sizes, resulting in steady increases of performance and functionality. New generations of devices have appeared in every two to three years, following the so-called "Moore's Law". Each new generation has approximately reduced transistor size by 30%, increased circuit performance by about 40%, doubled logic circuit density, and quadrupled memory capacity comparing to the previous generation. The consistency of this advancement has led to an expectation that faster and more powerful chips will continue to be introduced on the same schedule in the foreseeable future.

The metal oxide semiconductor field effect transistor (MOSFET) constitutes the fundamental building block of semiconductor technology. A large part of its success is due to the fact that it can be continuously scaled down to smaller dimensions while increasing circuit performance and lowering manufacturing cost. The ability to consistently improve performance while decreasing power consumption has made CMOS architecture the dominant technology for integrated circuits. The scaling of CMOS transistors has been the primary factor driving the improvement in microprocessor performance. In order to maintain such rapid rate of improvement, aggressive scaling of MOS devices presents considerable challenges to the semiconductor industry. The industry generally expects that within a decade or so, MOSFET will encounter critical technological barriers and fundamental physical limitations to size reduction. The major challenges include power consumption control, leakage current reduction, driving current improvement, thin gate insulators with high dielectric constant, metal gates with appropriate work functions, ultra-shallow source/drain junctions, parasitic resistance/capacitance reduction, statistical dopant fluctuation, and uniformity of device characteristics.

The most pressing limit to further miniaturization is the increase of power consumption. The power density at the chip surface is doubled for every 3.3 years. The rapid increase of heat generation is caused by insufficient reduction of power supply voltage and aggressive increase of transistor density. If the current trends in the clock frequency and the number of on-chip transistors continue, the power consumption of a high-performance microprocessor would reach 10 KW within several years and the heat generation at the chip surface would reach 1000 W/cm². By comparison, the power density is about 100 W/cm² for a light bulb filament, 1000 W/cm² for a rocket nozzle, and 6000 W/cm² for the surface of the sun. Furthermore, it is recognized that heat can only be removed from a surface at some finite rate. The maximum rate of thermal energy that can be removed from silicon surface at $T_{max} < 400°$ K is about 1000 W/cm² by convective cooling.

As the scaling of conventional planar bulk silicon CMOS transistors approaches its fundamental limits, innovative device structures and new materials must be considered to continue the historic progress in transistors. Some variations of MOSFET structures are being actively studied, which include ultra-thin body (UTB) silicon-on-insulator (SOI) MOSFETs, multi-gate MOSFETs (such as FinFET and Tri-Gate), SB-MOSFETs with Schottky barrier source/drain, carbon nanotube transistors (CNTs), and graphene nano-ribbon transistors. These non-classical MOSFETs are designed to improve short-channel effects and have better scalability than the planar bulk MOSFET. However, these non-classical devices are still MOSFETs; they face similar challenges for the planar bulk MOSFETs, such as increasing power consumption and performance saturation. The current trends of increasing chip speed and functional density are difficult to maintain by the MOSFET. Silicon technology has reached a point, at which significant innovations are required to circumvent the challenges associated with continued device scaling. There is a need for a new transistor device to continue the trends of increasing circuit performance, enhancing chip functionality, and lowering manufacturing cost.

Alternative device structures other than the MOSFET are being considered that might allow the continuation of scaling trends when physical limits of conventional MOSFETs are eventually reached. Two prior-art devices, metal base transistors (MBT) and resonant tunneling devices, both operating on the principle of quantum mechanical tunneling, are to be discussed.

The metal base transistor was an early attempt to achieve better performance than bipolar transistors. The device structure of the MBT has three different versions, but all of them have metal for the base. The first version is a metal-insulator-metal-insulator-metal (MIMIM) structure. FIG. 1a shows the MIMIM structure and its band diagram. When the device is properly biased, electrons are injected from the emitter to the base by tunneling through a thin insulating barrier. The injected electrons are called hot electrons since they have energies more than a few kT above the Fermi level in the base. The MIMIM device is also one of the hot-electron transistors and ballistic injection transistors. The hot electrons continue to travel through the base to the collector if they are not recombined in the base. The second version of the MBT has the base-to-collector MIM structure replaced by a metal-semiconductor Schottky junction. FIG. 1b shows the metal-insulator-metal-semiconductor (MIMS) structure and its band diagram. The third version of the MBT has both MIM structures replaced by metal-semiconductor Schottky junctions. FIG. 1c shows the semiconductor-metal-semiconductor (SMS) structure and its band diagram. The SMS MBT employs thermionic emission rather than tunneling injection of hot carriers into the base because the Schottky junction has smaller emitter-to-base barrier height than the MIM structure. Early MBTs have been plagued by two major problems, which are the poor base transport factor $\alpha_T$ due to their relatively large base widths and the difficulty of growth of good-quality single-crystal semiconductor materials on metals. Because of these problems, there has been very little development on the MBT in recent years.

A resonant tunnel device uses quantum effects to produce negative differential resistance. The device has a double-barrier quantum-well structure typically formed by the heterojunctions of III-V compound semiconductors (such as GaAs and AlGaAs) with large discontinuities in the conduction band. The electron energy in a quantum well is quantized. FIG. 2a shows the energy band diagram of a two-terminal double-barrier AlGaAs/GaAs/AlGaAs resonant tunneling diode (RTD) under a bias condition of resonance tunneling. Resonance occurs (i.e. the tunneling current reaches a maximum) when the injected electrons have certain energies coincide with the energies of the quasi-bound states in the quantum well. The tunneling current decreases when the energy deviates from the discrete energy levels. This leads to negative differential resistance in the I-V characteristics. This effect can be used for microwave generation and amplification. Peak-to-valley ratio is an important figure of merit for a RTD.

The energy band diagram of a three-terminal resonant tunneling transistor (RTT) is shown in FIG. 2b. The emitter has a larger band gap to minimize the flow of holes from the base to the emitter. A three-terminal device provides enhanced isolation between input and output, higher circuit gain, and greater fan-out capability than a two-terminal device. The I-V characteristics of a RTT exhibit negative differential resistance under certain bias conditions. The collector currents show a series of peaks corresponding to resonant through different energy states. In general, resonant tunneling devices can reduce circuit complexity by using fewer transistors per function compared to conventional MOSFET circuit design due to the inherent multi-state nature.

SUMMARY OF INVENTION

In a general aspect, the present invention relates to a semiconductor transistor device comprising one or more conductive base regions connected to a first electrical terminal; a first semiconductor barrier region in contact with the one or more conductive base regions, wherein a first Schottky barrier junction is formed at the interface of the first semiconductor barrier region and the one or more conductive base regions; a second semiconductor barrier region in contact with the one or more conductive base regions, wherein a second Schottky barrier junction is formed at the interface of the second semiconductor barrier region and the one or more conductive base regions; a conductive emitter region in contact with the first semiconductor barrier region, wherein a third Schottky barrier junction is formed at the interface of the conductive emitter region and the first semiconductor barrier region, wherein the conductive emitter region is connected to a second electrical terminal; and a conductive collector region in contact with the second semiconductor barrier region, wherein a fourth Schottky barrier junction is formed at the interface of the conductive collector region and the second semiconductor barrier region, wherein the conductive collector region is connected to a third electrical terminal, wherein at least one of the first semiconductor barrier region or the second semiconductor barrier region comprises a dimension smaller than 100 Å.

In another general aspect, the present invention relates to a semiconductor transistor device, comprising one or more conductive base regions; a first semiconductor barrier region in contact with the one or more conductive base regions, wherein a first Schottky barrier junction is formed at the interface of the first semiconductor barrier region and the one or more conductive base regions; a second semiconductor barrier region in contact with the one or more conductive base regions, wherein a second Schottky barrier junction is formed at the interface of the second semiconductor barrier region and the one or more conductive base regions; a conductive emitter region in contact with the first semiconductor barrier region, wherein a third Schottky barrier junction is formed at the interface of the conductive emitter region and the first semiconductor barrier region; and a conductive collector region in contact with the second semiconductor barrier region, wherein a fourth Schottky barrier junction is formed at the interface of the conductive collector region and the second semiconductor barrier region, wherein the one or more conductive base regions are configured to produce a tunneling current through the first semiconductor barrier region and the second semiconductor barrier region in response to a voltage applied to the one or more conductive base regions.

In another general aspect, the present invention relates to a semiconductor transistor device comprising one or more conductive base regions; a first semiconductor barrier region in contact with the one or more conductive base regions, wherein a first Schottky barrier junction is formed at the interface of the first semiconductor barrier region and the one or more conductive base regions; a second semiconductor barrier region in contact with the one or more conductive base regions, wherein a second Schottky barrier junction is formed at the interface of the second semiconductor barrier region and the one or more conductive base regions; a conductive emitter region in contact with the first semiconductor barrier region, wherein a third Schottky barrier junction is formed at the interface of the conductive emitter region and the first semiconductor barrier region; and a conductive collector region in contact with the second semiconductor barrier region, wherein a fourth Schottky barrier junction is formed at the interface of the conductive collector region and the second semiconductor barrier region, wherein the conductive emitter region, the one or more conductive base regions, or the conductive collector region comprises one or more of a metal, a silicide compound, a germanide compound, or a metallic compound, wherein the first semiconductor barrier region comprises a first layer sandwiched between the one or more conductive base regions and the conductive emitter region, wherein the second semiconductor barrier region comprises a second layer sandwiched between the one or more conductive base regions and the conductive collector region, wherein the first layer and the second layer are thinner than 50 Å, wherein the first layer or the second layer comprises silicon, wherein the first layer is parallel to a (100) or (110) crystal plane, wherein a quantum well is formed in the one or more conductive base regions between barriers provided by the first semiconductor barrier region and the second semiconductor barrier region, wherein the one or more conductive base regions are configured to produce a tunneling current through the first semiconductor barrier region and the second semiconductor barrier region in response to a voltage applied to the one or more conductive base regions.

In another general aspect, the present invention relates to a three-dimensional integrated circuit, comprising:
  a) a substrate;
  b) a first semiconductor transistor device, comprising
    i) a first conductive bottom electrode layer on the substrate;
    ii) a first semiconductor barrier layer in contact with the first conductive bottom electrode layer, wherein a first Schottky barrier junction is formed at the interface of the first semiconductor barrier layer and the first conductive bottom electrode layer;
    iii) a first conductive base layer in contact with the first semiconductor barrier layer, wherein a second Schottky barrier junction is formed at the interface of the first conductive base layer and the first semiconductor barrier layer;
    iv) a second semiconductor barrier layer in contact with the first conductive base layer, wherein a third Schottky barrier junction is formed at the interface of the second semiconductor barrier layer and the first conductive base layer; and
    v) a first conductive top electrode layer in contact with the second semiconductor barrier layer, a fourth Schottky barrier junction is formed at the interface of the first conductive top electrode layer and the second semiconductor barrier layer;

c) a first insulating layer; and
a) a second semiconductor transistor device, comprising
   i) a second conductive bottom electrode layer on the first insulating layer;
   ii) a third semiconductor barrier layer in contact with the second conductive bottom electrode layer, wherein a fifth Schottky barrier junction is formed at the interface of the third semiconductor barrier layer and the second conductive bottom electrode layer;
   iii) a second conductive base layer in contact with the third semiconductor barrier layer, wherein a sixth Schottky barrier junction is formed at the interface of the second conductive base layer and the third semiconductor barrier layer;
   iv) a fourth semiconductor barrier layer in contact with the second conductive base layer, wherein a seventh Schottky barrier junction is formed at the interface of the fourth semiconductor barrier layer and the second conductive base layer; and
   v) a second conductive top electrode layer in contact with the fourth semiconductor barrier layer, wherein a eighth Schottky barrier junction is formed at the interface of the second conductive top electrode layer and the fourth semiconductor barrier layer;
wherein the first semiconductor barrier layer, the first conductive base layer, and the second semiconductor barrier layer form a first double-barrier quantum well, wherein the third semiconductor barrier layer, the second conductive base layer, and the fourth semiconductor barrier layer form a second double-barrier quantum well, wherein a tunneling current through the first double-barrier quantum well is substantially controlled by the voltage in the first conductive base layer.

Implementations of the system may include one or more of the following. The first semiconductor barrier region can include a first layer sandwiched between the one or more conductive base regions and the conductive emitter region, wherein the first layer is thinner than 100 Å. The first layer comprises silicon, wherein the first layer is parallel to a (100) or (110) crystal plane. The second semiconductor barrier region can include a second layer sandwiched between the one or more conductive base regions and the conductive collector region, wherein the second layer is thinner than 100 Å. The first semiconductor barrier region or the second semiconductor barrier region can include a semiconductors material selected from the group consisting of silicon, germanium, and III-V compound semiconductors. At least one of the first semiconductor barrier region or the second semiconductor barrier region has a layered structure having a thinness thinner than 50 Å. A quantum well is formed in the one or more conductive base regions between barriers provided by the first semiconductor barrier region and the second semiconductor barrier region. The one or more conductive base regions can produce a tunneling current through the first semiconductor barrier region and the second semiconductor barrier region in response to a voltage applied to the one or more conductive base regions. The work function in the one or more conductive base regions can be closer to the conduction band edge than to the valence band edge in at least one of the first semiconductor barrier region or the second semiconductor barrier region. The tunneling current primarily can include electrons as majority carriers. The voltage applied to the one or more conductive base regions can be positive relative to the emitter voltage. The one or more conductive base regions can include a layer of $NiSi_2$ thinner than 20 Å. The layer of $NiSi_2$ can be parallel to (100) crystal plane. The work function in the one or more conductive base regions can be closer to the valence band edge than to the conduction band edge in at least one of the first semiconductor barrier region or the second semiconductor barrier region. The tunneling current can include holes as majority carriers. The voltage applied to the one or more conductive base regions can be negative relative to the emitter voltage. The one or more conductive base regions can include a layer of $CoSi_2$ thinner than 20 Å. The layer of $CoSi_2$ can be parallel to (100) crystal plane. At least one of the first semiconductor barrier region or the second semiconductor barrier region can be substantially undoped. The conductive emitter region, the one or more conductive base regions, or the conductive collector region can include one or more of a metal, a silicide compound, a germanide compound, or a metallic compound. At least one of the first semiconductor barrier region or the second semiconductor barrier region can include a Si/Ge heterojunction structure. The Si/Ge heterojunction structure can have a combined thickness smaller than 60 Å. The one or more conductive base regions can include a first conductive base region in contact with the first semiconductor barrier region, a semiconductor base barrier region in contact with the first conductive base region, and a second conductive base region in contact with the second semiconductor barrier region.

Embodiments may include one or more of the following advantages. The Schottky Barrier Quantum Well Resonant Tunneling Transistor (SBQWRTT) disclosed in the present specification provides a solution for future device scaling beyond the physical limitations faced by conventional MOSFET devices. The disclosed SBQWRTT has a simpler device structure and better scalability than conventional MOSFET devices. The disclosed SBQWRTT does not require photolithography to define its critical dimensions. Active layers are grown by epitaxy with precise thickness control. The device structure does not have shallow junctions and thin gate insulator as required in the MOSFET. Variations of device characteristics are much smaller because statistical dopant fluctuation and line edge roughness (LER), which are two major sources of device variations in the MOSFET, do not exist in the SBQWRTT. The SBQWRTT has a smaller transistor size and a higher circuit density. The SBQWRTT can operate at a much higher speed because the device operation is based on quantum mechanical tunneling and ballistic transport. The SBQWRTT can operate at a lower power supply voltage and consumes less energy because of smaller subthreshold swing and faster turn-on behavior. The base layer is atomically thin without suffering the so-called short-channel effect as in the MOSFET. The SBQWRTT fabrication process is simpler and costs less because less photo masking steps are used and there are no requirements of ultra-shallow junctions, high-k metal-gate stack, embedded SiGe S/D, and dual stressor layers. The SBQWRTT is therefore more scalable than the MOSFET for the future small geometry device.

The SBQWRTT chip disclosed in the present specification consumes less power than a comparable CMOS chip. The SBQWRTT can operate at a lower power supply voltage than the MOSFET, for example, 0.2 V or below. Small subthreshold swing is the key for low $V_{CC}$, so that the SBQWRTT can be turned on and off in a small voltage range. The current conduction mechanism is resonant tunneling. A high transmission coefficient in resonance greatly improves the driving current. The transmission coefficient drops by orders of magnitude if the energy of injected carriers is slightly off the resonant energy. The small subthreshold swing and fast turn-on behavior are attributed to the resonant tunneling effect. For a MOSFET, the subthreshold swing is degraded with shrinking the gate length due to the short channel effect. For a MOSFET and a SBQWRTT with comparable source-to-drain and emitter-to-collector distances, the SBQWRTT has a much smaller subthreshold swing than the MOSFET.

The SBQWRTT disclosed in the present specification has smaller parasitic resistances than the MOSFET. Less power will be wasted in the parasitic components, and higher driving current can be delivered by the SBQWRTT. For a MOSFET, the source/drain extensions need to be shallow in order to control the short-channel effect. The source/drain series resistances and contact resistances are increased when scaling down the junction depth and contact size. The increasing parasitic resistances substantially degrade the driving current and consume more power. It is challenging to produce ultra shallow junctions with low sheet resistance. For a SBQWRTT, the emitter/base/collector regions are made of low-resistance metals or silicides. The emitter/collector series resistances of a SBQWRTT are much smaller than the source/drain series resistances of a MOSFET. The metal-to-metal or metal-to-silicide contact resistances to the emitter/base/collector regions of a SBQWRTT are much smaller than the silicide-to-semiconductor source/drain contact resistances of a MOSFET.

The SBQWRTT disclosed in the present specification can be operated at a high speed because of low parasitic resistances, small base width, quantum mechanical tunneling effect, ballistic transport of carriers, and large driving current. The emitter/base/collector regions of a SBQWRTT are made of low-resistance metals or silicides, which significantly reduce the series resistances. The semiconductor emitter and collector barrier regions can be undoped to eliminate the impurity scattering. The intrinsic speed of a tunneling device is much faster than a device such as FET or BJT operating on drift or diffusion process. SBQWRTTs offer an attractive advantage for high-speed applications. For a MOSFET, the source/drain series resistances and the contact resistances are increased when the S/D junction depths and the contact size are scaled down. The channel doping is increased to suppress the short channel effect in a planar bulk MOSFET. The increasing parasitic resistances and channel doping densities substantially degrade the driving current. Although the device speed is improved by scaling down the gate length, the performance improvement has been slowed down in recent years. The delay from the parasitic resistances plays an increasingly important role. Currently the speed improvement is achieved by using a large $V_{DD}$ (at the expense of large power consumption) and strained silicon to improve driving current and boost carrier mobilities. Both strategies are expected to run out of steam in the near future.

The SBQWRTT disclosed in the present specification has a smaller transistor size and a higher packing density than the MOSFET. More SBQWRTTs can be packed on the same area than MOSFETs. The minimum size of a SBQWRTT is basically determined by the contact size and contact-to-contact space that can be provided by photolithographic and etching processes. The SBQWRTT is a three-terminal device, and typically has a rectangular shape in layout. By using Si/Ge heterojunctions in the p-type devices, the driving currents of n- and p-type SBQWRTTs are more balanced. N- and p-type SBQWRTTs can occupy the same active area with one stacking on top of the other, which further increases the packing density. A conventional planar bulk MOSFET is a four-terminal device with substrate contact being the fourth terminal. Design rules also require a safe distance between S/D contacts to poly gate. MOSFET layout generally has an irregular shape because of poly end cap and poly contact. The MOSFET generally has a larger transistor size than the SBQWRTT.

The SBQWRTT disclosed in the present specification is a general-purpose transistor. The I-V characteristics and inverter transfer curve of SBQWRTTs are generally similar to those of MOSFETs and BJTs although their device operation mechanisms are very different. The SBQWRTT is suitable for both digital and analog circuit applications. In digital applications, a transistor is a three-terminal switch where the conductance between two terminals is strongly controlled by the third. Since $I_C$ is an exponential function of $V_B$, the turn-on behavior of a SBQWRTT is strongly dependent on $V_B$, indicating the SBQWRTT is suitable for low-power and high-speed applications. The analog design with SBQWRTTs resembles traditional analog design using BJTs because both devices have exponential relationship between $I_C$ and $V_B$.

The SBQWRTTs disclosed in the present specification can be fabricated on silicon substrates for low cost and compatibility with today's manufacturing infrastructure. The SBQWRTT fabrication process is simpler and costs less than a CMOS process because of less photo masking steps are required. The SBQWRTT requires no ultra-shallow S/D junctions with extremely high dopings. The SBQWRTT requires no thin gate insulator with a high dielectric constant, low leakage, and low interface state density. The SBQWRTT requires no thin silicon body (as in UTB MOSFETs on SOI) or thin silicon fin (as in FinFETs). The SBQWRTT requires no stress techniques to boost mobility. The active layers are epitaxially grown by molecular-beam epitaxy (MBE) or atomic layer deposition (ALD) in an ultra-high vacuum (UHV) environment. Critical dimensions in vertical direction can be more precisely controlled by crystal growth than the horizontal dimensions defined by photolithography. Since ALD has already been used in advanced CMOS processes to deposit high-k gate insulator, the SBQWRTT fabrication process is basically compatible with today's silicon manufacturing technology.

The SBQWRTTs disclosed in the present specification can be fabricated with other devices such as MOSFETs and BJTs on a combo chip. MOSFETs or BJTs can be used in high-voltage high-current applications such as input/output devices, and high-precision analog applications such as sensing amplifiers. SBQWRTTs can be used in core logic for low-$V_{CC}$ high-speed digital applications.

The details of one or more embodiments are set forth in the accompanying drawing and in the description below. Other features, objects, and advantages of the invention will become apparent from the description and drawings, and from the claims.

BRIEF DESCRIPTION OF THE DRAWINGS

The accompanying drawing, which are incorporated in and form a part of this specification, illustrate embodiments of the invention and, together with the description, serve to explain the principles of the invention:

FIG. 1a shows the device structure and energy band diagram of a metal base transistor having a MIMIM structure.

FIG. 1b shows the device structure and energy band diagram of a metal base transistor having a MIMS structure.

FIG. 1c shows the device structure and energy band diagram of a metal base transistor having a SMS structure.

FIG. 2a is the energy band diagram of a double-barrier AlGaAs/GaAs/AlGaAs resonant tunneling diode under a bias condition of resonance tunneling.

FIG. 2b is the energy band diagram of a resonant tunneling transistor having an abrupt emitter and double-barrier AlGaAs/GaAs/AlGaAs quantum-well base under a bias condition of resonance tunneling.

FIG. 3 is a schematic drawing of a SBQWRTT in accordance with the present invention having a metal-semiconductor-metal-semiconductor-metal (MSMSM) structure.

FIGS. 4a-e are band diagrams of an n-type SBQWRTT under different bias conditions.

DETAILED DESCRIPTION OF THE INVENTION

Figure 4B:
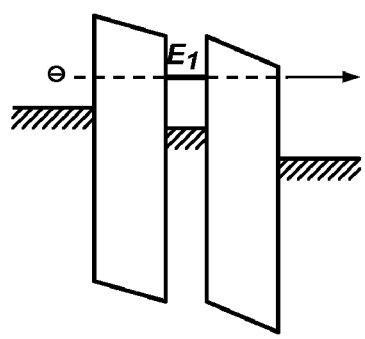

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Schottky Barrier Quantum Well Resonant Tunneling Transistor (SBQWRTT) is a three-terminal device having a metal-semiconductor-metal-semiconductor-metal (MSMSM) structure. A schematic drawing of an SBQWRTT 30 is shown in FIG. 3. The three terminals are the emitter terminal 36, base terminal 37, and collector terminal 38. The MSMSM structure consists of emitter region 31, emitter barrier region 32, base region 33, collector barrier region 34, and collector region 35. The emitter region 31, base region 33, and collector region 35 are made of metals, metal compounds, metallic silicides, or metallic germanides. The emitter barrier region 32 and collector barrier region 34 are made of semiconductors, which can be a single layer of semiconductor or a heterostructure of semiconductors with different band gaps. The semiconductor layers can be either undoped (for the reductions of impurity scattering and statistical dopant fluctuation) or doped. There are four Schottky barrier junctions in this structure. Schottky junction is created by intimate contact of metal (or silicide) and semiconductor. $W_B$ is the base width (or thickness), $W_{EB}$ is the width (or thickness) of the emitter barrier region 32, and $W_{CB}$ is the width (or thickness) of the collector barrier region 34. When the structure is fabricated by epitaxial growth, the width is in vertical dimension. The width of a region sometimes means layer thickness. The emitter region 31, emitter barrier region 32, base region 33, collector barrier region 34, and collector region 35 can also be referred to as emitter layer, emitter barrier layer, base layer, collector barrier layer, and collector layer, respectively. The conductive emitter region 31, base region 33, and collector region 35 can also be called electrode layers. In the present disclosure, a terminal, or an electrical terminal, or an electrode refers to an electric contact that connects a region of the semiconductor device to an external circuit. An electrically conductive material such as metal forms a terminal.

The SBQWRTT can be a symmetric or an asymmetric device. For example, the emitter barrier region 32 and the collector barrier region 34 can have the same or different widths, doping densities, or semiconductor materials. The emitter region 31 and the collector region 35 can be made of the same or different metals or silicides. When the SBQWRTT is a symmetric device, its emitter terminal 36 and collector terminal 38 are interchangeable in circuit design.

FIGS. 4a-e show band diagrams of an n-type SBQWRTT under different bias conditions: (a) thermal equilibrium, i.e. $V_E=V_B=V_C=0V$, (b-d) $V_B>0V, V_C=V_{CC}$, and $V_E=0V$, and (e) $V_C=V_{CC}$ and $V_E=V_B=0V$. $E_C$ is the conduction band edge, $E_V$ is the valence band edge, and $E_F$ is the Fermi level, and $V_{CC}$ is the power supply voltage. The Schottky barrier heights (SBH) for electrons, $q\phi_{bn}$, are denoted as 41, 42, 43, and 44 for the four Schottky junctions of emitter barrier-to-emitter, emitter barrier-to-base, collector barrier-to-base, and collector barrier-to-collector, respectively. The Schottky barrier heights for holes, $q\phi_{bp}$, are denoted as 45, 46, 47, and 48 for the four Schottky junctions of emitter barrier-to-emitter, emitter barrier-to-base, collector barrier-to-base, and collector barrier-to-collector, respectively. The SBQWRTT can be called "H transistor" for short because the dumbbell shaped band diagram in FIG. 4a looks like the letter "H".

The SBQWRTT has two complementary device types, i.e. n-type and p-type. The primary carriers are electrons in an n-type SBQWRTT, and holes in a p-type SBQWRTT. Two complimentary device types are necessary in circuit design to reduce the power consumption. CMOS technology has been very successful partially because of its low power consumption by having two complimentary device types. For an n-type SBQWRTT, the Schottky barrier heights $q\phi_{bn}$ 41-44 for electrons are generally smaller than the Schottky barrier heights $q\phi_{bp}$ 45-48 for holes. For a p-type SBQWRTT, the Schottky barrier heights $q\phi_{bp}$ 45-48 for holes are generally smaller than the Schottky barrier heights $q\phi_{bn}$ 41-44 for electrons.

A Schottky junction creates discontinuities in the conduction band and the valence band. Schottky junctions can be used to build heterostructures that operate on the principle of quantum effects, similar to the heterostructures made of III-V compound semiconductors with different band gaps. The conduction band of a SBQWRTT forms a double-barrier quantum well as shown in FIG. 4a. The Fermi level of the base has a lower potential than the conduction bands of the emitter barrier and the collector barrier by the electron SBH $q\phi_{bn}$ 42, and 43. If the base width $W_B$ (i.e. well thickness) is smaller than the de Broglie wavelength, the motion of electrons in the direction perpendicular to the Schottky junctions is quantized. Electrons can only have discrete energy values inside the quantum well. $E_1$ is the ground state energy in the quantum well. $E_1$ is dependent on $W_B$, but it is essentially independent of $W_{EB}$ and $W_{CB}$.

Figure 4C:
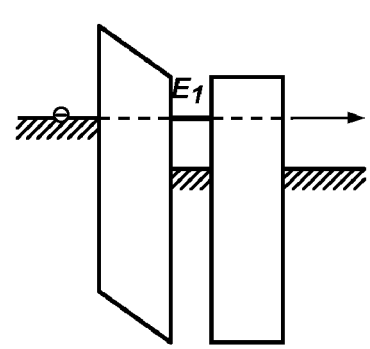
Figure 4D:
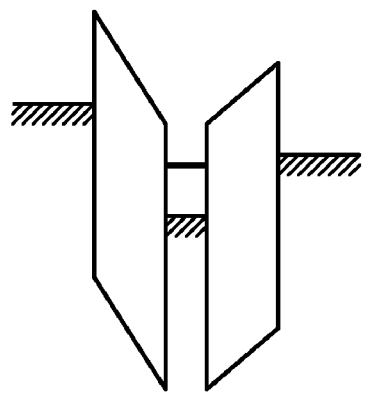
Figure 5A:
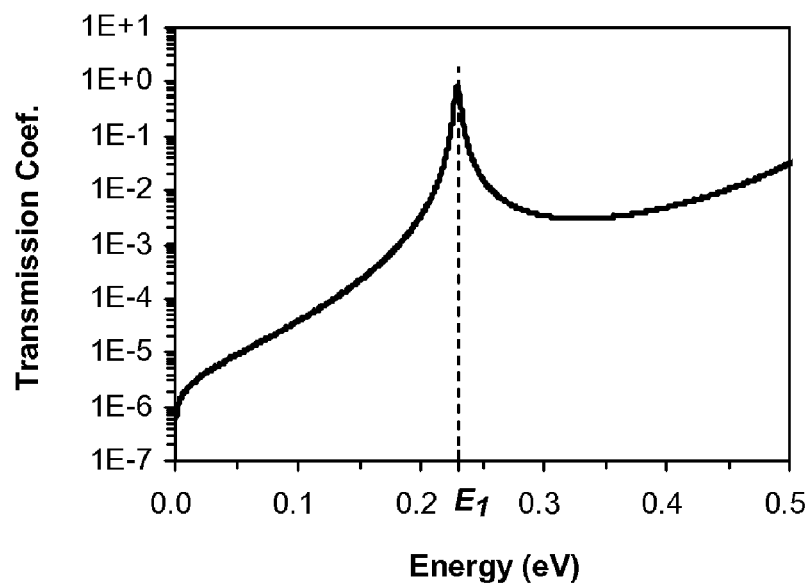
FIG. 5a is a plot showing the dependence of transmission coefficient on electron energy of an n-type SBQWRTT.
Figure 5B:
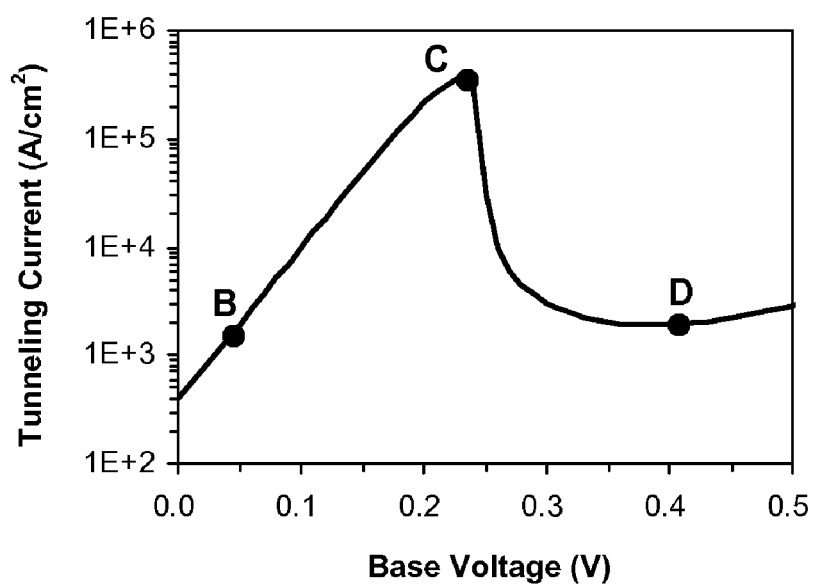
FIG. 5b is a plot illustrating an exemplified current-voltage characteristic curve of an n-type SBQWRTT.

The base voltage is progressively increased in FIGS. 4b-d while keeping $V_E=0V$ and $V_C=V_{CC}$. The energy states in the well are lowered with increasing $V_B$. FIG. 5a shows transmission coefficient versus the energy of an injected electron to the well, and FIG. 5b shows current-voltage characteristic curve of an n-type SBQWRTT. The transmission coefficient can be obtained by solving the one-dimensional Schroedinger equation. The tunneling current is proportional to the transmission coefficient multiplied by the occupation probability in the emitter and the unoccupied probability in the collector. The operating points labeled as B, C, and D in FIG. 5b correspond to the three different bias conditions in FIGS. 4b-d, respectively.

In FIG. 4b, when the Fermi level in the emitter is below $E_1$, only electrons with high energy equal to $E_1$ can tunnel through the double barrier. The electron density versus energy follows the Fermi-Dirac distribution. As $V_B$ increases, more electrons will have energy equal to $E_1$, so the tunneling current increases exponentially with $V_B$. Theoretically, the minimal subthreshold swing that can be achieved by the device at room temperature is $kT/q \cdot \ln(10)=60$ mV/dec, which is controlled by the Fermi-Dirac distribution.

When the base voltage is increased, the Fermi level in the emitter is lined up with $E_1$, as shown in FIG. 4c. An incident electron has an energy E that exactly equals one of the discrete energy levels inside the well, it will tunnel through the double-barrier quantum well with a unity, 100%, transmission coefficient, as shown in FIG. 5a. The quantum well is said to be "in resonance", and a maximum amount of current flows through the structure. This peak current is labeled as point C in FIG. 5b.

When the base voltage is further increased, the transmission coefficient decreases rapidly as the energy E deviates from the discrete energy levels. For an electron in the emitter of a given energy to tunnel through the double barrier, there must be an empty state with the same energy in the collector. If $E_1$ is below the Fermi level of the collector, as shown in FIG. 4d, the empty states available in the collector are very few. The number of electrons that can tunnel decreases, resulting in a small valley current, shown as point D in FIG. 5b.

Figure 4E:
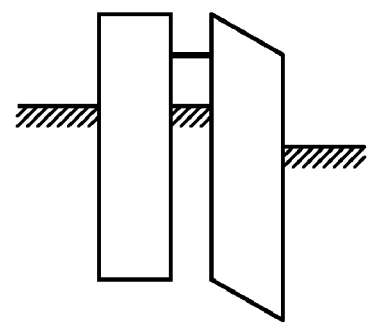

FIG. 4e illustrates a bias condition, $V_C=V_{CC}$ and $V_E=V_B=0$ V, in which the device has a base leakage current. The electrons in the base region 33 could tunnel through the collector barrier region 34 to the collector region 35. Because of the quantum confinement, only discrete energy levels exist in the quantum well. The available density of states in the two-dimensional system is low, so the base leakage current is very small.

For an n-type SBQWRTT having a structure as shown in FIG. 4a, the barrier layer widths ($W_{EB}$ and $W_{CB}$), base width ($W_B$), and Schottky barrier heights ($q\phi_{bn}$ 41-44 and $q\phi_{bp}$ 45-48) are important design parameters. In the following paragraphs, we are going to discuss their effects on the device characteristics such as driving current, subthreshold swing, and leakage current for an n-type symmetric SBQWRTT operating at $V_{CC}=0.2$ V power supply voltage.

Figure 6A:
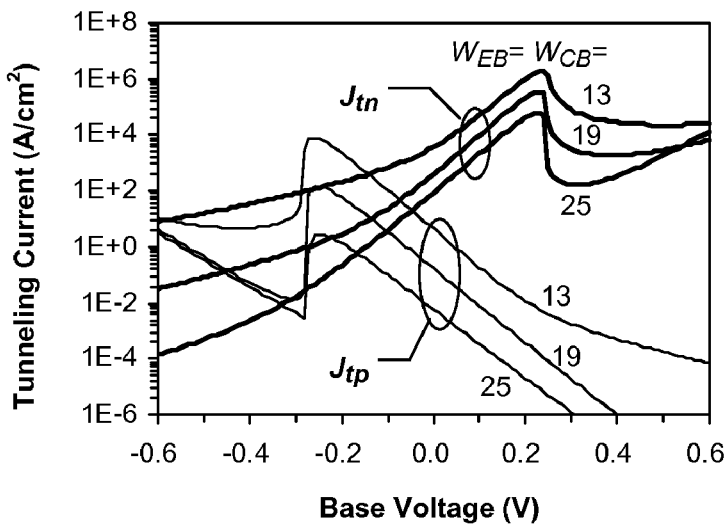
FIG. 6a shows electron and hole tunneling currents, $J_{tn}$ and $J_{tp}$, in an n-type SBQWRTT as functions of base voltage $V_B$ for $W_{EB}=W_{CB}=13$, 19, and 25 ML.

For an n-type symmetric SBQWRTT under the following conditions: un-doped (100) Si for the emitter barrier region 32 and collector barrier region 34, $W_{EB}=W_{CB}$, (100) $NiSi_2$ for the emitter region 31, base region 33, and collector region 35, $W_B=2$ ML (monolayers), $V_E=0$ V, and $V_C=0.2$ V. Electron SBH $q\phi_{bn}$ is 0.4 eV for the Schottky junction between (100) $NiSi_2$ and (100) Si. FIG. 6a shows the electron and hole tunneling currents, $J_{tn}$ and $J_{tp}$, as functions of $V_B$ for $W_{EB}=W_{CB}=13$, 19, and 25 ML. $J_{tn}$ represents the tunneling current of electrons from emitter to collector, and $J_{tp}$ represents the tunneling current of holes from collector to emitter. Both electron and hole tunneling currents increase with decreasing the barrier layer thickness (both $W_{EB}$ and $W_{CB}$). For an n-type SBQWRTT, electrons are the majority carriers, and hole current is the leakage current.

Both electron and hole tunneling currents exhibit negative differential resistance (NDR) due to resonance tunneling. The NDR can be used for microwave generation and amplification in resonant tunneling devices. However, for a general-purpose transistor, the NDR effect can seriously degrade driving current and subthreshold swing. The device needs to be biased properly so that the NDR effect does not come into play in normal circuit operation. In the case of FIG. 6a, NDR occurs when $V_B>0.23$ V. If the power supply voltage $V_{CC}$ is set at 0.2 V, then the NDR effect will not occur in circuit operation.

Figure 6B:
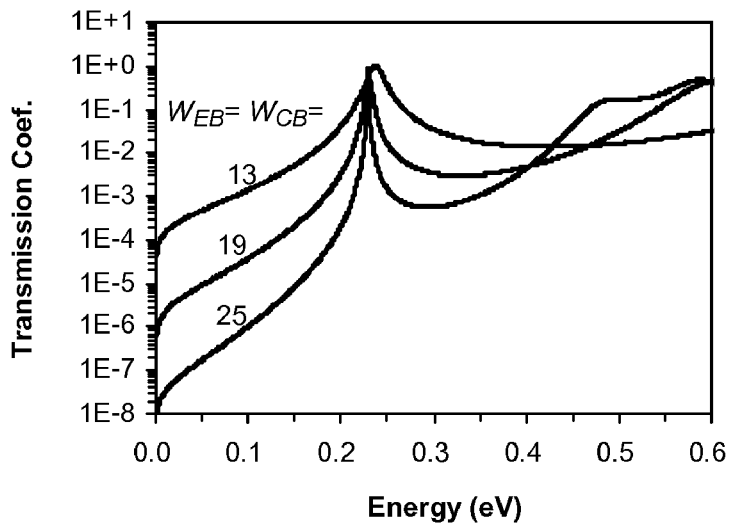
FIG. 6b is a plot showing the dependence of electron transmission coefficient on energy in an n-type SBQWRTT for $W_{EB}=W_{CB}=13$, 19, and 25 ML at $V_B=0$ V.

FIG. 6b shows electron transmission coefficient versus energy for $W_{EB}=W_{CB}=13$, 19, and 25 ML at $V_B=0$ V. The transmission coefficient reaches its maximum of 100% when the injected electron has an energy equal to $E_1$, which is about 0.23 eV. It is found that $E_1$ is basically independent of the barrier layer thickness, $W_{EB}$ and $W_{CB}$. The transmission coefficient decreases rapidly when the energy is deviated from the resonant energy, especially for a thicker barrier layer. As the barrier layer becomes thinner, the double-barrier quantum well becomes more transparent to carriers. The resonant tunneling peak in the transmission coefficient curve becomes more obscure.

Figure 6C:
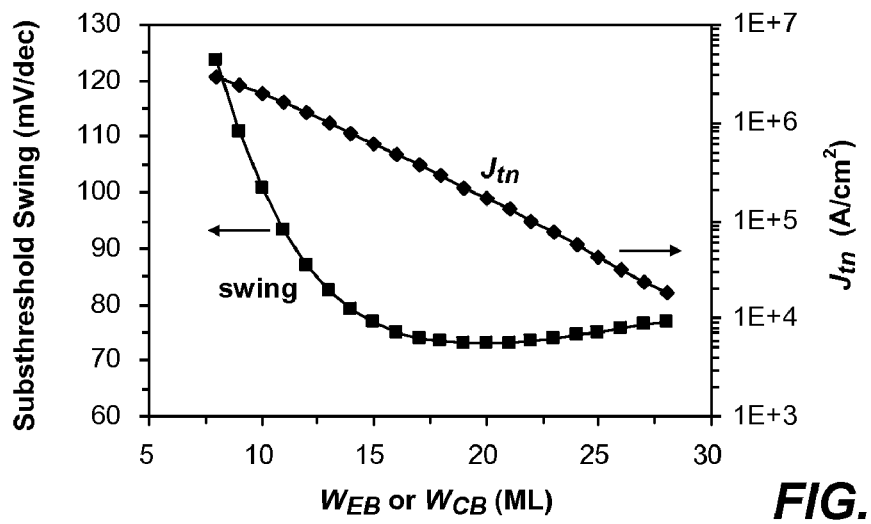
FIG. 6c shows subthreshold swing and electron tunneling current $J_{tn}$ versus barrier layer thickness ($W_{EB}=W_{CB}$) in an n-type SBQWRTT.

FIG. 6c shows subthreshold swing (between $V_B=0$ and 0.2 V) and on-state electron tunneling current $J_{tn}$ at $V_B=0.2$ V versus barrier layer thickness, in which $W_{EB}=W_{CB}$. The electron tunneling current increases monotonically with decreasing the barrier layer thickness. The subthreshold swing has a minimum value of 73.2 mV/dec when $W_{EB}=W_{CB}=19$ ML. The subthreshold swing becomes larger when the barrier layer thickness is larger or smaller than 19 ML. The subthreshold swing increases rapidly with decreasing the barrier layer thickness when $W_{EB}<12$ ML and $W_{CB}<12$ ML. As the barrier layer thickness becomes very thin, the barrier layers cannot confine a quantum state in the double-barrier quantum well. The double-barrier quantum well becomes transparent to carriers, and the resonant tunneling effect becomes smeared. The ratio of on/off current becomes smaller, and the subthreshold swing becomes larger. The optimal barrier layer thickness, $W_{EB}=W_{CB}=19$ ML, is much smaller than the electron mean free path of scattering in un-doped Si, so electrons can travel through the barrier layers without scattering. The emitter barrier region 32 and the collector barrier region 34 are preferred to be undoped to minimize the statistical dopant fluctuation and Coulomb scattering due to ionized impurities.

The base width $W_B$ needs to be small to achieve high current gain and fast transistor switching speed. The electrons injected to the base region 33 can have energies more than a few kT above the Fermi level in the base region 33, where k is the Boltzmann's constant and T is the lattice temperature. These electrons are called hot electrons because they are not in thermal equilibrium with the lattice. These hot electrons traverse through the base region 33 at high velocities, so a short transit time and a potentially large current gain could be obtained. The electron density in a metal is high. The injected electrons in the base region 33 have a high rate of energy loss due to inelastic electron-electron scatterings. The mean free path of mobile electrons in metals is much smaller than that in semiconductors. In a metal, the mean free time between carrier collisions is about 10 to 100 fs for electrons with an energy of 0.4 eV above Fermi level at room temperature, which corresponds to a mean free path of about 10-100 Å (assuming the carrier velocity is of the order of $10^7$ cm/s). When the total distance between the emitter and collector is much smaller than the mean free path of scattering, most hot electrons injected from the emitter can traverse the double barriers and quantum well ballistically, and reach the collector.

Figure 7A:
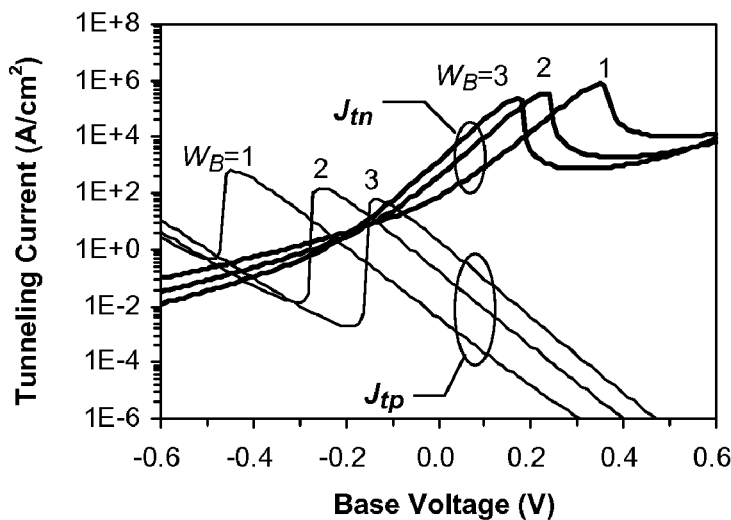
FIG. 7a shows electron and hole tunneling currents, $J_{tn}$ and $J_{tp}$, in an n-type SBQWRTT as functions of $V_B$ for $W_B=1$, 2, and 3 ML.
Figure 7B:
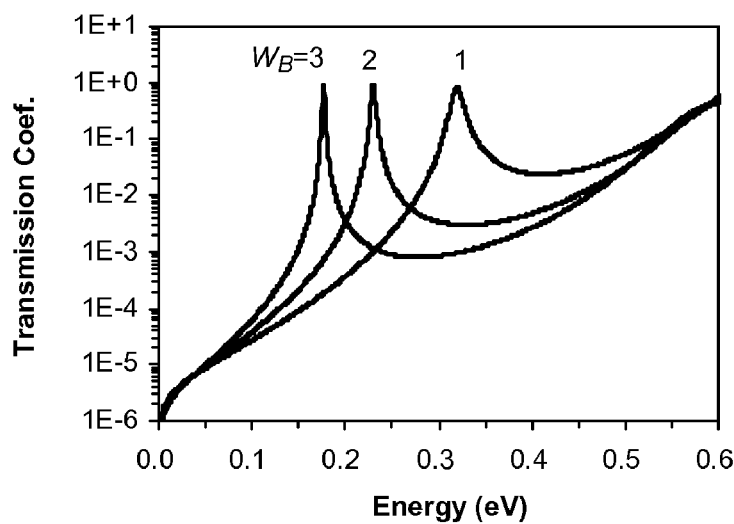
FIG. 7b shows electron transmission coefficient versus electron energy in an n-type SBQWRTT for $W_B=1$, 2, and 3 ML at $V_B=0$ V.
Figure 7C:
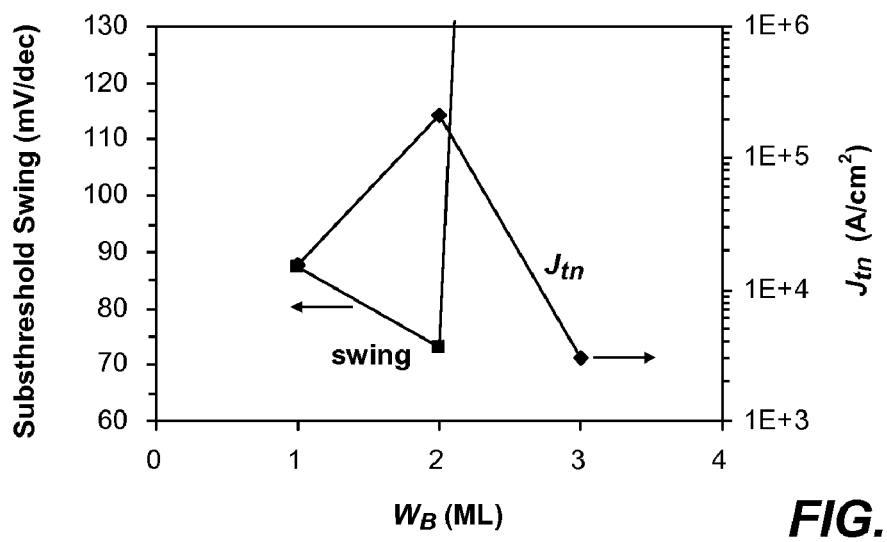
FIG. 7c shows subthreshold swing and electron tunneling current $J_{tn}$ versus $W_B$ in an n-type SBQWRTT.

The device characteristics are strongly dependent on $W_B$. For an n-type symmetric SBQWRTT under the following conditions: un-doped (100) Si for the emitter barrier layer 32 and collector barrier layer 34, $W_{EB}=W_{CB}=19$ ML, (100) $NiSi_2$ for the emitter region 31, base region 33, and collector region 35, $V_E=0$ V, and $V_C=0.2$ V. Electron SBH $q\phi_{bn}$ is 0.4 eV for the Schottky junction between (100) $NiSi_2$ and (100) Si. FIG. 7a shows the electron and hole tunneling currents, $J_{tn}$ and $J_{tp}$, as functions of $V_B$ for $W_B=1$, 2, and 3 ML. FIG. 7b shows the electron transmission coefficient versus energy for $W_B=1$, 2, and 3 ML at $V_B=0$ V. FIG. 7c shows the subthreshold swing (between $V_B=0$ and 0.2 V) and the electron tunneling current $J_{tn}$ at $V_B=0.2$ V versus $W_B$. As shown in FIG. 7b, the resonant energy is decreased with increasing $W_B$. When $W_B$ increases from 1 ML to 2 ML, $J_{tn}$ is initially increased with decreasing $E_1$ as shown in FIG. 7c. When $W_B$ increases from 2 ML to 3 ML, $E_1$ becomes smaller than 0.2 eV as shown in FIG. 7b. NDR effect occurs in the $V_{CC}$ operation range, which degrades the drive current and swing. A smaller $W_B$ can have a larger $E_1$ and a wider operation range. However, the driving current may not be large enough if $E_1$ is much larger than $V_{CC}$. Therefore, $E_1$ needs to be larger than $V_{CC}$, but not too much. FIG. 7c shows that there is an optimal value for $W_B$ (=2 ML), at which the $J_{tn}$ is the largest and the swing is the smallest.

Figure 8A:
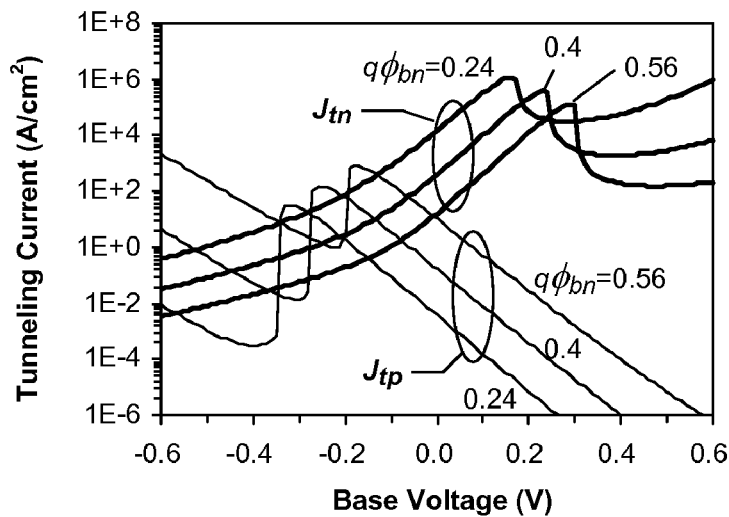
FIG. 8a shows electron and hole tunneling currents, $J_{tn}$ and $J_{tp}$, in an n-type SBQWRTT as functions of $V_B$ for $q\phi_{bn}=0.24$, 0.4, and 0.56 eV.
Figure 8B:
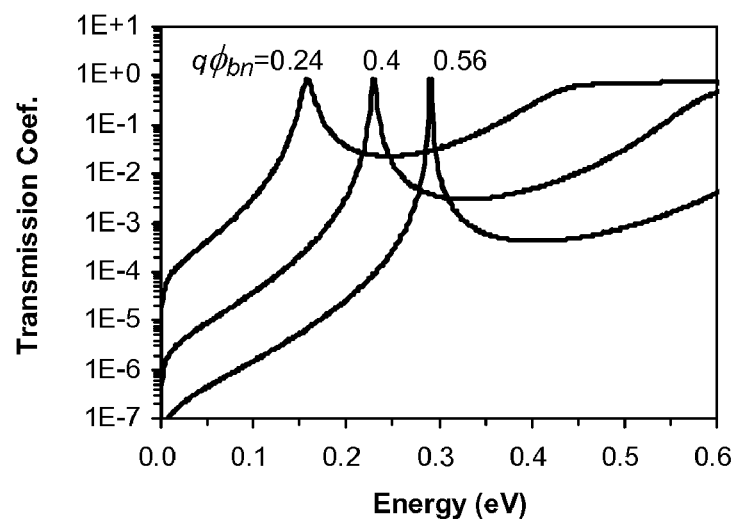
FIG. 8b shows electron transmission coefficient versus electron energy in an n-type SBQWRTT for $q\phi_{bn}=0.24$, 0.4, and 0.56 eV at $V_B=0$ V.
Figure 8C:
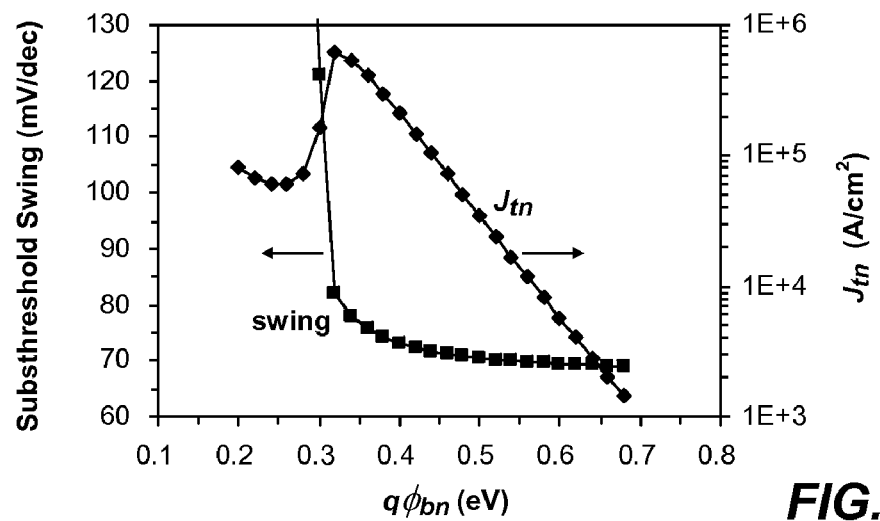
FIG. 8c shows subthreshold swing and electron tunneling current $J_{tn}$ versus $q\phi_{bn}$ in an n-type SBQWRTT.

The device characteristics are dependent on the Schottky barrier heights. For an n-type symmetric SBQWRTT under the following conditions: un-doped (100) Si for the emitter barrier layer 32 and the collector barrier layer 34, $W_{EB}=W_{CB}=19$ mL, the same metal for the emitter region 31, base region 33, and collector region 35, $W_B=2$ ML, $V_E=0$ V, and $V_C=0.2$ V. Assume the metal has an electronic SBH of $q\phi_{bn}$ with (100) Si for electrons. FIG. 8a shows the electron and hole tunneling currents, $J_{tn}$ and $J_{tp}$, as functions of base voltage for $q\phi_{bn}=0.24$, 0.4, and 0.56 eV. FIG. 8b shows the electron transmission coefficient versus energy for $q\phi_{bn}=0.24$, 0.4, and 0.56 eV at $V_B=0$ V. FIG. 8c shows the subthreshold swing (between $V_B=0$ and 0.2 V) and the on-state electron tunneling current $J_{tn}$ (at $V_B=0.2$ V) versus $q\phi_{nb}$. When $q\phi_{bn}$ is reduced, $E_1$ is decreased and $J_{tn}$ is increased. $J_{tn}$ reaches its peak when $q\phi_{bn}=0.32$ eV and $E_1=0.2$ eV. If $q\phi_{bn}$ is further reduced, $J_{tn}$ starts to decrease and the swing can be degraded significantly because of the occurrence of NDR within $V_{CC}=0.2$ V operation range.

Schottky barrier height is an important parameter in device design. The SBH depends on the metal work function, crystal orientation, and surface conditions. For most metal/silicon or silicide/silicon Schottky junctions, the surface Fermi levels are close to the silicon mid band gap, typically in the range of $E_i\pm 0.4$ eV, where $E_i$ is intrinsic Fermi level. Ideally, a SBQWRTT can be an ambipolar device, which can be operated as either an n- or a p-type transistor depending on the bias condition. Ambipolar devices can simplify the fabrication process because only one type of device is to be fabricated. The same kind of metal (or silicide) can be used for different metal regions (emitter region 31, base region 33, and collector region 35) in ambipolar devices. Since electrons have a higher effective Richardson constant and a smaller effective mass than those of holes, ambipolar devices with symmetric driving currents, $J_{tn}=J_{tp}$, can be achieved if $q\phi_{bn}$ is slightly larger than $q\phi_{bp}$. However, FIG. 8c shows the driving current is less than $10^4$ A/cm² if $q\phi_{bn}$ is larger than 0.56 eV (=$E_g/2$). Ambipolar devices have a simpler fabrication process, but the performance is not optimized. In order to deliver the best performance for both n- and p-type devices, each device needs to be optimized individually.

Figure 9A:
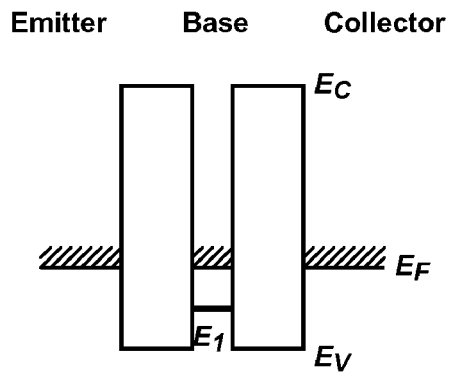
FIG. 9a illustrates a band diagram for a p-type SBQWRTT at thermal equilibrium. The emitter and collector barriers are formed with homogeneous layers of undoped semiconductor.
Figure 10A:
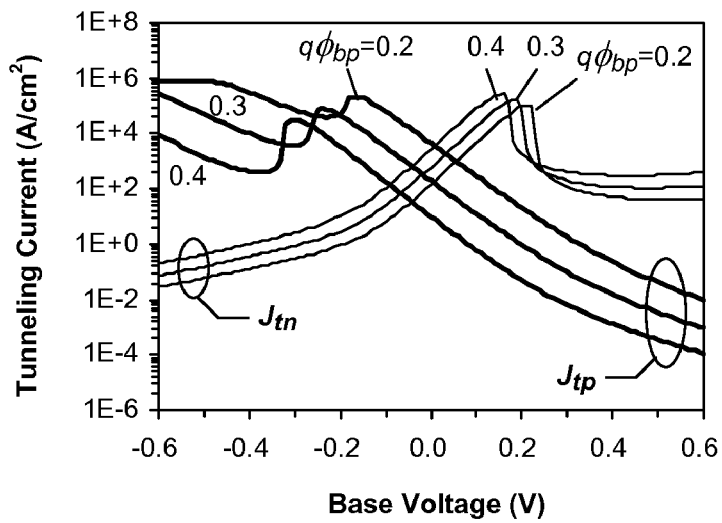
FIG. 10a shows hole and electron tunneling currents, $J_{tp}$ and $J_{tn}$, in a p-type SBQWRTT as functions of $V_B$ for $W_{EB}=W_{CB}=15$ ML and $q\phi_{bp}=0.2$, 0.3, and 0.4 eV.
Figure 10B:
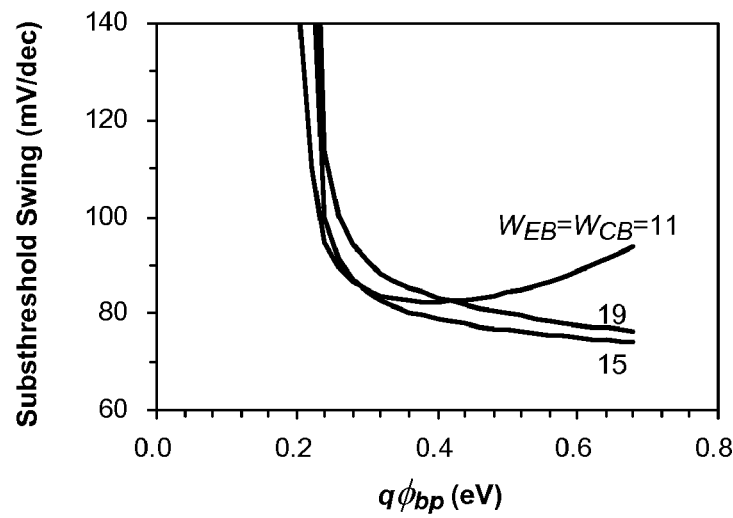
FIG. 10b shows subthreshold swing versus $q\phi_{bp}$ in a p-type SBQWRTT for $W_{EB}=W_{CB}=11$, 15, and 19 ML.
Figure 10C:
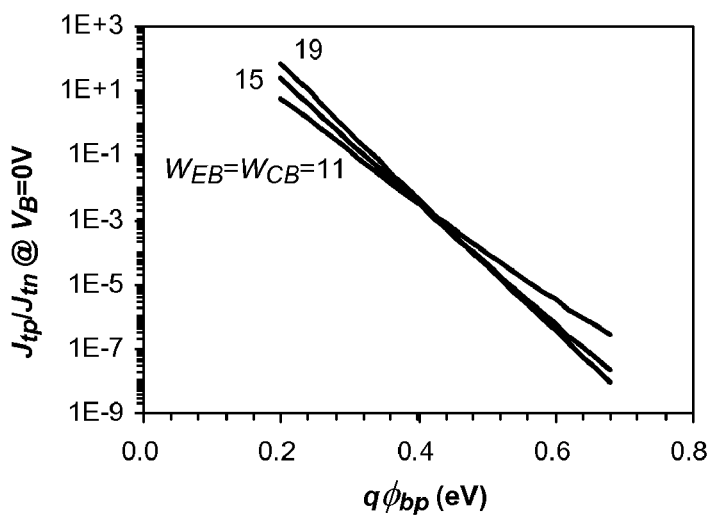
FIG. 10c shows current ratio of $J_{tp}/J_{tn}$ at off state versus $q\phi_{bp}$ in a p-type SBQWRTT for $W_{EB}=W_{CB}=11$, 15, and 19 ML.

The p-type SBQWRTT can have a device structure similar to the n-type SBQWRTT in FIG. 4a, but with metal Fermi levels closer to the valance band. FIG. 9a shows the band diagram of such p-type SBQWRTT under thermal equilibrium. The p-type SBQWRTT has the following attributes: un-doped (100) Si for the emitter barrier layer 32 and collector barrier layer 34, and $W_B$=2 ML. The hole SBH is $q\phi_{bp}$ for the emitter region 31, base region 33, and collector region 35 in contact with (100) Si. The p-type SBQWRTT is biased at $V_E$=0 V and $V_C$=−0.2 V. FIG. 10a shows the hole and electron tunneling currents, $J_{tp}$ and $J_{tn}$, as functions of $V_B$ for $W_{EB}$=$W_{CB}$=15 ML and $q\phi_{bp}$=0.2, 0.3, and 0.4 eV. When $q\phi_{bp}$ becomes smaller, $E_1$ becomes smaller and NDR occurs at smaller $V_B$. Since holes have a smaller effective Richardson constant and a larger effective mass than electrons, $q\phi_{bp}$ needs to be smaller than 0.3 eV to improve hole driving current and suppress electron leakage current. FIG. 10b shows the subthreshold swing (between $V_B$=0 and −0.2 V) versus $q\phi_{bp}$ for $W_{EB}$=$W_{CB}$=11, 15, and 19 ML. FIG. 10c shows the leakage current ratio of $J_{tp}/J_{tn}$ at off state ($V_B$=0 V) versus $q\phi_{bp}$ for $W_{EB}$=$W_{CB}$=11, 15, and 19 ML. Decreasing $q\phi_{bp}$ can increase the value of $J_{tp}/J_{tn}$. To have a reasonable value of $J_{tp}/J_{tn}$, for example, larger than 1, $q\phi_{bp}$ needs to be smaller than 0.25 eV. However, the subthreshold swing is seriously degraded when $q\phi_{bp}$ is too small due to the NDR effect. A large barrier layer thickness, $W_{EB}$ and $W_{CB}$, can slightly improve the ratio of $J_{tp}/J_{tn}$ but degrades the driving current.

Figure 9B:
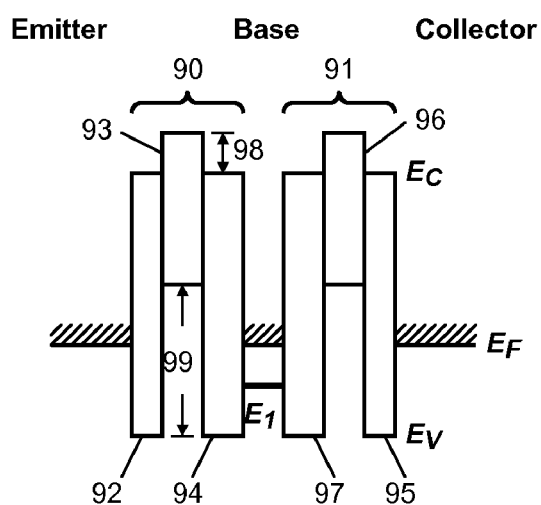
FIG. 9b illustrates a band diagram for a p-type SBQWRTT at thermal equilibrium. The emitter and collector barriers are formed with Si/Ge/Si heterostructures.
Figure 9C:
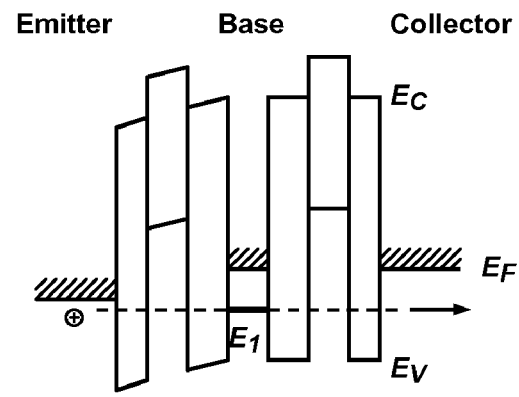
FIG. 9c illustrates a band diagram for the p-type SBQWRTT as shown in FIG. 9b biased at resonance. The emitter and collector barriers are formed with Si/Ge/Si heterostructures.

The p-type SBQWRTT can be constructed with heterostructures for the emitter and collector barrier regions (32 and 34) to solve the dilemma of driving current and subthreshold swing. FIG. 9b shows the band diagram of a p-type symmetric SBQWRTT under thermal equilibrium. The emitter barrier region 90 is composed of a silicon layer 92 with a thickness of $W_{Si,1}$, a germanium layer 93 with a thickness of $W_{Ge}$, and a silicon layer 94 with a thickness of $W_{Si,2}$. The collector barrier region 91 is composed of a silicon layer 95 with a thickness of $W_{Si,1}$, a germanium layer 96 with a thickness of $W_{Ge}$, and a silicon layer 97 with a thickness of $W_{Si,2}$. The conduction band offset 98 and valence band offset 99 are 0.28 and 0.74 eV respectively at the Si and Ge interface. FIG. 9c shows the band diagram of the p-type SBQWRTT biased at resonance, in which the energy of an injected hole becomes approximately equal to the energy level $E_1$ and the transmission coefficient is maximal.

Figure 11A:
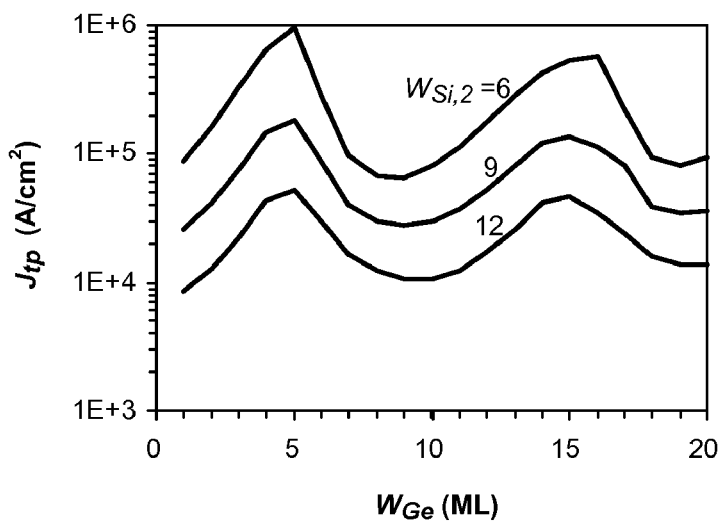
FIG. 11a shows on-state hole tunneling current $J_{tp}$ in a p-type SBQWRTT as a function of $W_{Ge}$ for $W_{Si,2}=6$, 9, and 12 ML.
Figure 11B:
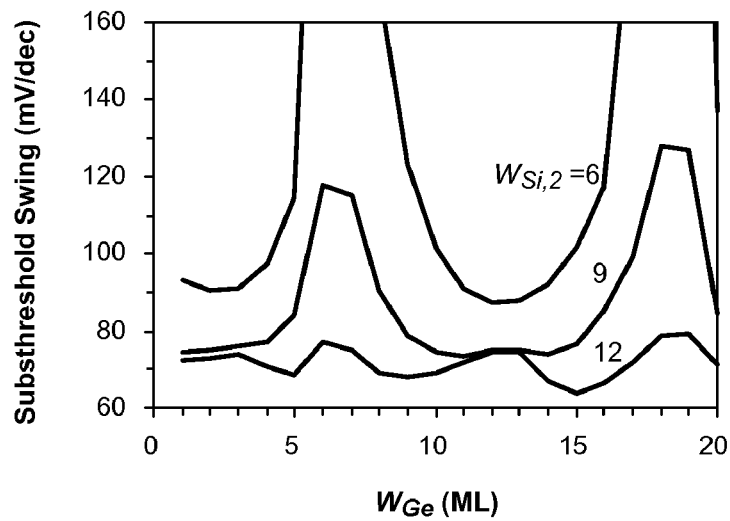
FIG. 11b shows subthreshold swing versus $W_{Ge}$ in a p-type SBQWRTT for $W_{Si,2}=6$, 9, and 12 ML.
Figure 11C:
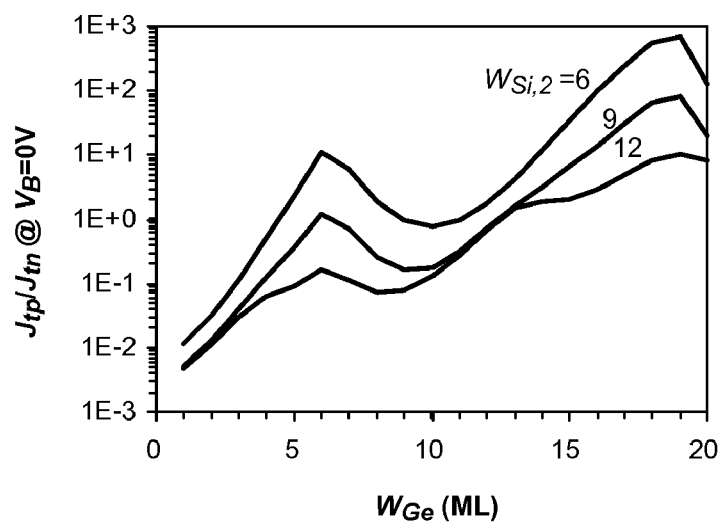
FIG. 11c shows current ratio $J_{tp}/J_{tn}$ at off state versus $W_{Ge}$ in a p-type SBQWRTT for $W_{Si,2}=6$, 9, and 12 ML.

The device characteristics of a p-type SBQWRTT having the structure as shown in FIG. 9b are dependent on the Si and Ge layer thicknesses ($W_{Si,1}$, $W_{Si,2}$, and $W_{Ge}$). Assume a p-type SBQWRTT has the following attributes: Si/Ge/Si heterostructures for the emitter barrier region 90 and collector barrier region 91, $W_{Si,1}$=2 ML, (100) CoSi₂ for the emitter region 31, base region 33, and collector region 35, $W_B$=2 ML, $V_E$=0 V, and $V_C$=−0.2 V. The hole SBH $q\phi_{bp}$ is 0.38 eV for the Schottky junction between (100) CoSi₂ and (100) Si. FIG. 11a shows the on-state hole tunneling current at $J_{tp}$ at $V_B$=−0.2 V as a function of $W_{Ge}$ for $W_{Si,2}$=6, 9, and 12 ML. FIG. 11b shows the subthreshold swing (between $V_B$=0 and −0.2 V) versus $W_{Ge}$ for $W_{Si,2}$=6, 9, and 12 ML. FIG. 11c shows the current ratio of $J_{tp}/J_{tn}$ at off state ($V_B$=0 V) versus $W_{Ge}$ for $W_{Si,2}$=6, 9, and 12 ML. In the $W_{Ge}$ range of interest, the on-state current $J_{tp}$ has two peaks roughly at $W_{Ge}$=5 and 15 ML as shown in FIG. 11a. When $J_{tp}$ becomes maximal, the subthreshold swing is roughly minimal. The Si/Ge/Si heterostructure forms a quantum well for holes. The transistor structure as shown in FIG. 9b has three quantum wells for holes in total. The discrete energy level in the Si/Ge/Si quantum wells can affect the resonant tunneling. Depending on the Ge layer thickness, $W_{Ge}$, the transmission coefficient can have a sharp peak at the resonant energy $E_1$ just.

Figure 12A:
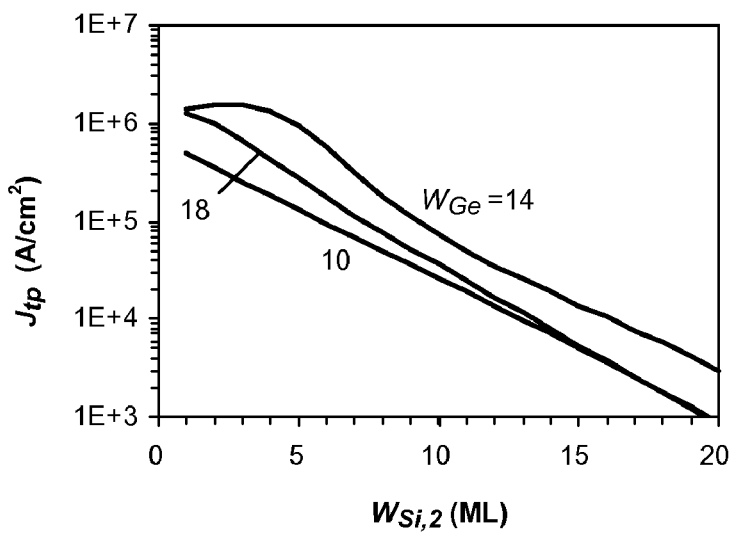
FIG. 12a shows on-state hole tunneling current $J_{tp}$ in a p-type SBQWRTT as a function of $W_{Si,2}$ for $W_{Ge}=10$, 14, and 18 ML.
Figure 12B:
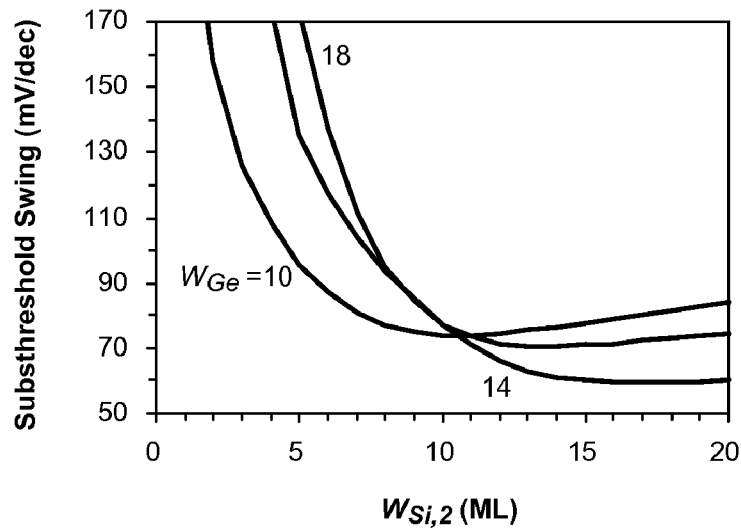
FIG. 12b shows subthreshold swing versus $W_{Si,2}$ in a p-type SBQWRTT for $W_{Ge}=10$, 14, and 18 ML.
Figure 12C:
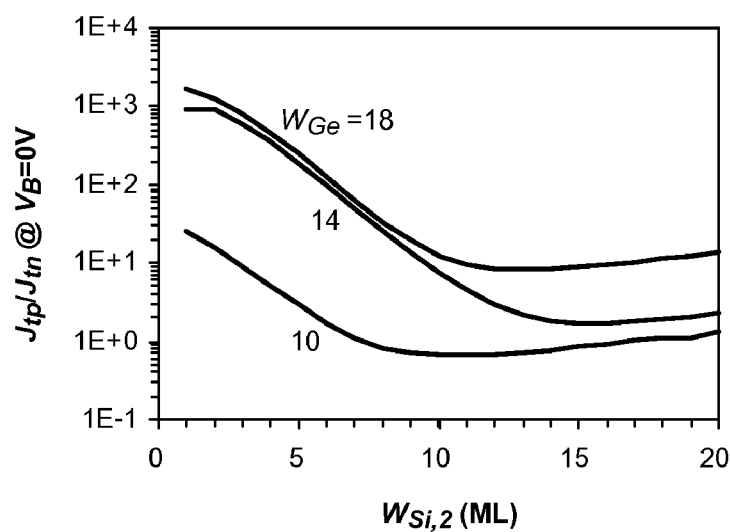
FIG. 12c shows current ratio $J_{tp}/J_{tn}$ at off state versus $W_{Si,2}$ in a p-type SBQWRTT for $W_{Ge}=10$, 14, and 18 ML.

FIG. 12a shows the on-state hole tunneling current $J_{tp}$ at $V_B$=−0.2 V as a function of $W_{Si,2}$ for $W_{Ge}$=10, 14, and 18 ML. FIG. 12b shows the subthreshold swing (between $V_B$=0 and −0.2 V) versus $W_{Si,2}$ for $W_{Ge}$=10, 14, and 18 ML. FIG. 12c shows the current ratio of $J_{tp}/J_{tn}$ at off state ($V_B$=0 V) versus $W_{Si,2}$ for $W_{Ge}$=10, 14, and 18 ML. The on-state hole tunneling current $J_{tp}$ increases with decreasing $W_{Si,2}$. For $W_{Ge}$=14 ML, the subthreshold swing becomes minimal when $W_{Si,2}$ is above 14 ML. The subthreshold swing increases rapidly with decreasing $W_{Si,2}$ when $W_{Si,2}$ is smaller than 7 ML. When the barrier layer thickness $W_{Si,2}$ is too small, the potential barrier become almost transparent to carriers. The quasi-bound states cannot be confined in the quantum well. The sharp peak of transmission coefficient at the resonant energy becomes obscured, the on/off current ratio is reduced, and the subthreshold swing is degraded. Similar phenomenon has been observed in the n-type SBQWRTT as shown in FIG. 6c.

Figure 13A:
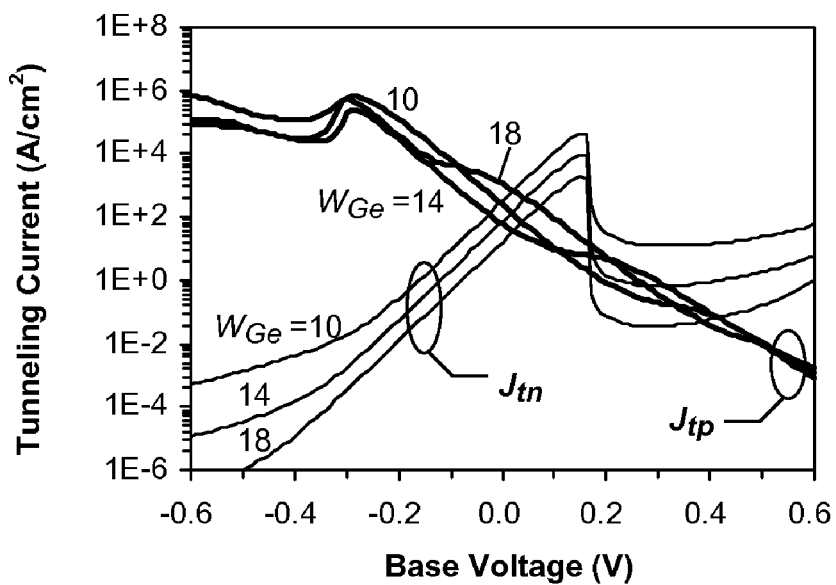
FIG. 13a shows hole and electron tunneling currents, $J_{tp}$ and $J_{tn}$, in a p-type SBQWRTT as functions of $V_B$ for $W_{Ge}=10$, 14, and 18 ML.
Figure 13B:
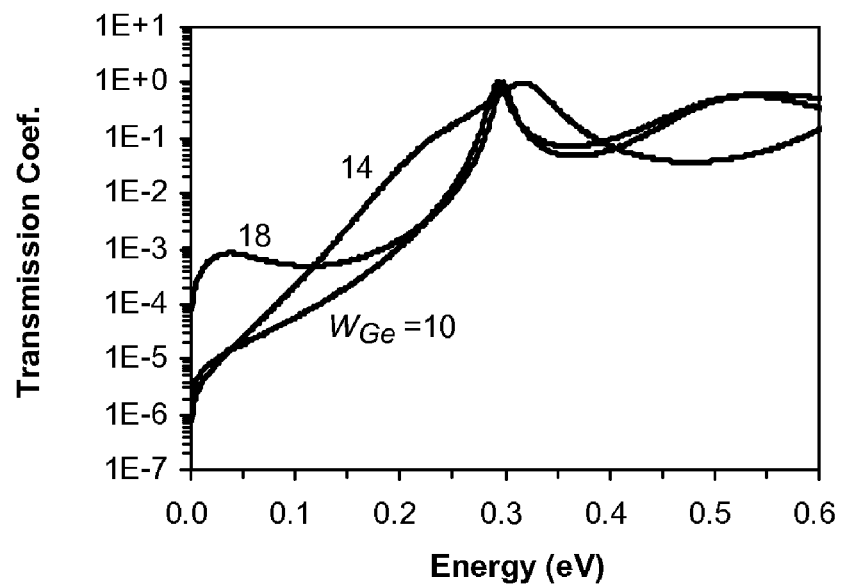
FIG. 13b shows hole transmission coefficient versus energy in a p-type SBQWRTT for $W_{Ge}=10$, 14, and 18 ML at $V_B=0$ V.

FIG. 13a shows the hole and electron tunneling currents, $J_{tp}$ and $J_{tn}$, as functions of $V_B$ for $W_{Ge}$=10, 14, and 18 ML. FIG. 13b shows the hole transmission coefficient versus energy for $W_{Ge}$=10, 14, and 18 ML at $V_B$=0 V. $W_{Si,2}$=9 ML in FIGS. 13a and 13b. Increasing the Ge layer thickness $W_{Ge}$ can effectively suppress the electron leakage current. It is interesting to see that there is another peak in the transmission coefficient curve at low energy (about 0.05 eV) for $W_{Ge}$=18 ML. The Si/Ge/Si heterostructure forms a quantum well for holes. The transmission coefficient could have multiple peaks due to the multiple quantum wells. When multiple peaks occur in the transmission coefficient curve, the off-state current ratio $J_{tp}/J_{tn}$ becomes smaller and the subthreshold swing becomes larger.

Figure 14A:
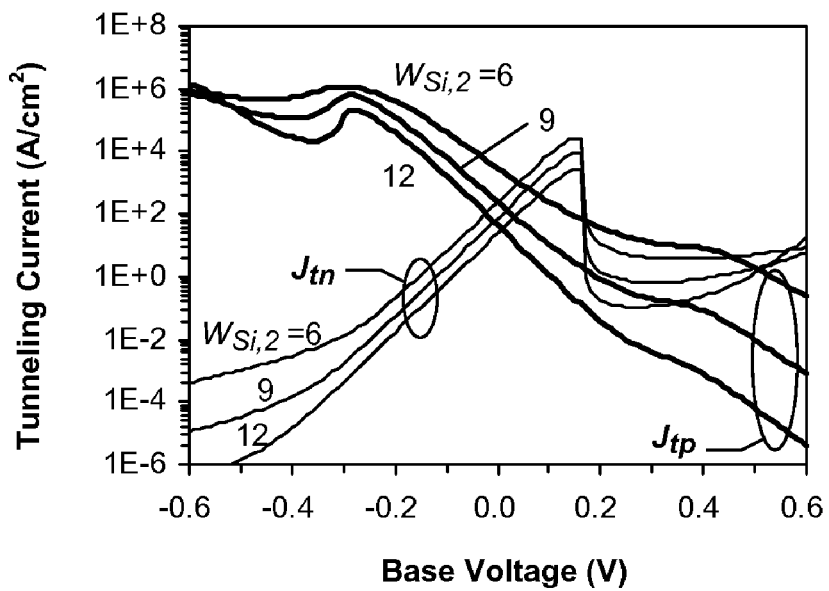
FIG. 14a shows hole and electron tunneling currents, $J_{tp}$ and $J_{tn}$, in a p-type SBQWRTT as functions of $V_B$ for $W_{Si,2}=6$, 9, and 12 ML.
Figure 14B:
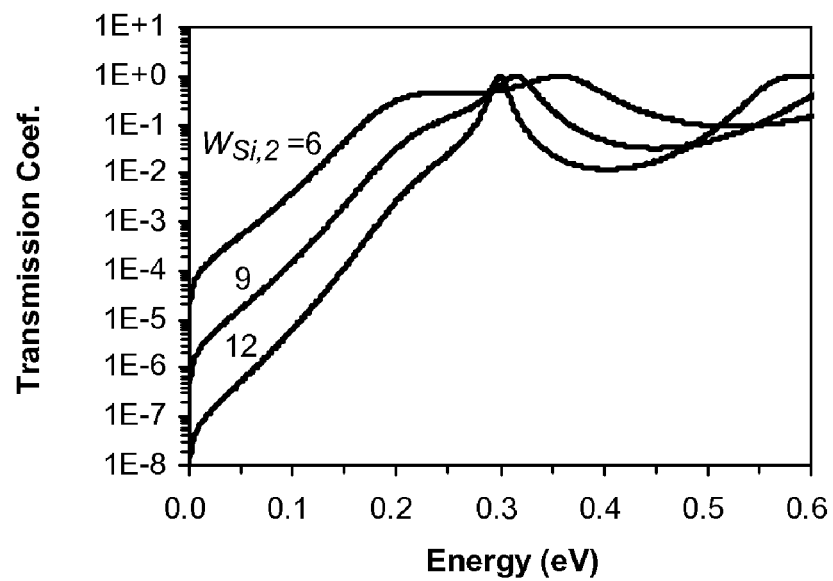
FIG. 14b shows hole transmission coefficient versus energy in a p-type SBQWRTT for $W_{Si,2}=6$, 9, and 12 ML.

FIG. 14a shows the hole and electron tunneling currents, $J_{tp}$ and $J_{tn}$, as functions of $V_B$ for $W_{Si,2}$=6, 9, and 12 ML. FIG. 14b shows the hole transmission coefficient versus hole energy for $W_{Si,2}$=6, 9, and 12 ML. $W_{Ge}$=14 ML in FIGS. 14a and 14b. Both $J_{tp}$ and $J_{tn}$ increase with decreasing $W_{Si,2}$. When the barrier thickness is very small, the potential barrier becomes almost transparent to carriers. Quasi-bound states cannot be confined in the quantum well. The hole transmission coefficient no longer has a sharp peak at the resonant energy. For example, the transmission coefficient of $W_{Si,2}$=6 ML in FIG. 14b is fairly flat versus energy. Holes of wide energy range can tunnel through the double-barrier quantum well with a high probability. The resonant tunneling effect is weakened, and the subthreshold swing is seriously degraded when $W_{Si,2}$ is too small.

The optimized device structures based on the simulation results are shown in TABLE 1. Their device characteristics are shown in TABLE 2. For an n-type SBQWRTT, $J_{t,on}$ is the on-state driving current when $V_B$=$V_C$=0.2 V, $J_{t,off}$ is the off-state leakage current when $V_B$=0 V and $V_C$=0.2 V, $V_{t,lin}$ is defined as the $V_B$ when $J_{tn}=1\times10^3$ A/cm$^2$ and $V_C=0.01$ V, $V_{t,sat}$ is defined as the $V_B$ when $J_{tn}=1\times10^3$ A/cm$^2$ and $V_C=0.2$ V, DIBL (drain induced barrier lowering) is defined as $(V_{t,lin}-V_{t,sat})/(0.2$ V$-0.01$ V) following the definition for MOSFETs. Emitter is always ground, $V_E=0$ V. The polarities of terminal voltages are reversed for a p-type SBQWRTT.

TABLE 1

| Structure Para. | n-type SBQWRTT | p-type SBQWRTT |
|---|---|---|
| Emitter | NiSi$_2$ | CoSi$_2$ |
| Emitter Barrier | Si, W$_{EB}$ = 19 ML | Si/Ge/Si, W$_{Si,1}$/W$_{Ge}$/W$_{Si,2}$ = 2/14/9 ML |
| Base | NiSi$_2$, W$_B$ = 2 ML | CoSi$_2$, W$_B$ = 2 ML |
| Collector Barrier | Si, W$_{CB}$ = 19 ML | Si/Ge/Si, W$_{Si,1}$/W$_{Ge}$/W$_{Si,2}$ = 2/14/9 ML |
| Collector | NiSi$_2$ | CoSi$_2$ |
| Orientation | (100) | (100) |
| SBH | q$\phi_{bn}$ = 0.4 eV | q$\phi_{bp}$ = 0.38 eV |

TABLE 2

| Device Para. | n-type SBQWRTT | p-type SBQWRTT |
|---|---|---|
| $J_{t,on}$ (A/cm$^2$) | 2.13 × 10$^5$ | 1.24 × 10$^5$ |
| $J_{t,off}$ (A/cm$^2$) | 3.95 × 10$^2$ | 2.38 × 10$^2$ |
| $J_{t,on}/J_{t,off}$ | 539 | 520 |
| Swing (mV/dec) | 73.2 | 73.6 |
| $V_{t,lin}$ (V) | 0.079 V | −0.077 V |
| $V_{t,sat}$ (V) | 0.03 V | −0.044 V |
| DIBL (mV/V) | 262 | 177 |
| $V_{CC}$ (V) | 0.2 | 0.2 |

Figure 15A:
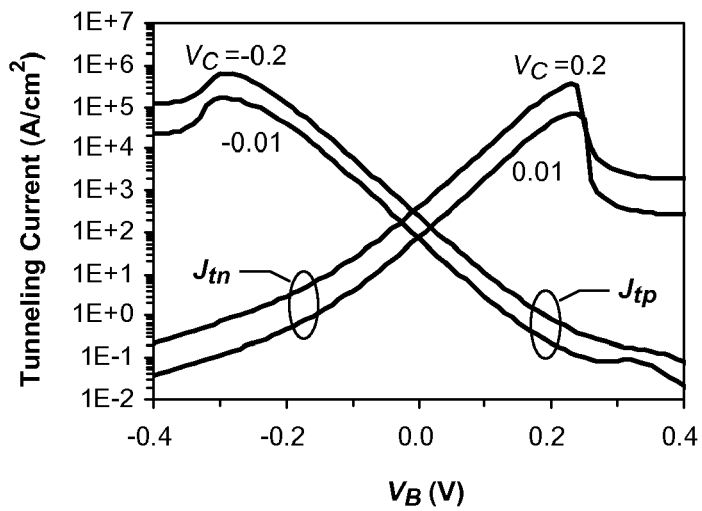
FIG. 15a shows electron tunneling current $J_{tn}$ in an n-type SBQWRTT and hole tunneling current $J_{tp}$ of a p-type SBQWRTT as functions of $V_B$ for two different $V_C$.

FIG. 15a shows the electron and hole tunneling currents, $J_{tn}$ and $J_{tp}$, as functions of $V_B$ at two different $V_C$ for the n- and p-type SBQWRTTs as specified in TABLE 1. $J_t$ increases exponentially with $V_B$ for $V_B$ within the $V_{CC}$ range. For a MOSFET, $I_D$ is an exponential function of $V_G$ only in the subthreshold region. $I_D$ becomes saturated with $V_G$ in the log($I_D$)–$V_G$ plot when the device is strongly turned on.

Figure 15B:
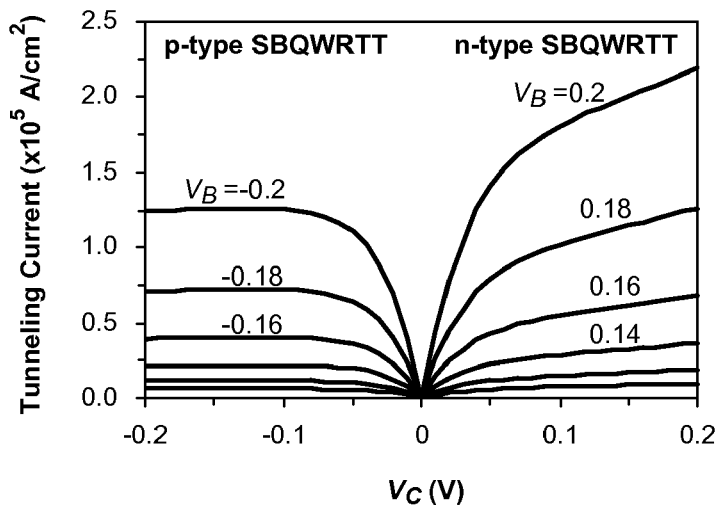
FIG. 15b shows $J_t$-$V_C$ characteristics in n-type and p-type SBQWRTTs.
Figure 15C:
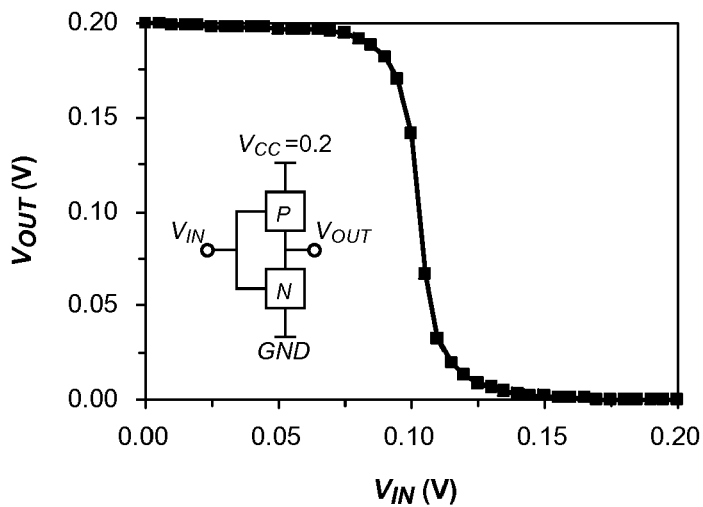
FIG. 15c shows transfer curve and circuit diagram of a SBQWRTT inverter.

FIG. 15b shows the $J_t$-$V_C$ characteristics for the n- and p-type SBQWRTTs. The driving current of the n-type SBQWRTT is about 70% larger than that of the p-type SBQWRTT. A p-type SBQWRTT can operate at parity with an n-type SBQWRTT if the p-type SBQWRTT is larger than the n-type SBQWRTT. For the n-type SBQWRTT, $J_{tn}$ increases continuously with $V_C$ and never saturates. While for the p-type SBQWRTT, $J_{tp}$ becomes saturated with $V_C$ when $|V^C|$ is larger than 0.1 V. The p-type SBQWRTT has a smaller DIBL than the n-type SBQWRTT, which is attributed to the structure difference. The p-type SBQWRTT has a Si/Ge/Si heterojunction in the emitter barrier region 90 and the collector barrier region 91, while the n-type SBQWRTT has Si layers for both regions (32 and 34). For both n- and p-type SBQWRTTs, the $J_t$-$V_C$ curves are further spaced apart with increasing $V_B$ because $J_{tn}$ and $J_{tp}$ are exponential functions of $V_B$. FIG. 15c shows the transfer curve and circuit diagram of a SBQWRTT inverter. The p-type SBQWRTT is 50% larger than the n-type SBQWRTT to compensate its lower driving current. Despite of so many differences in the device characteristics, device structure, and operation mechanism between SBQWRTTs and MOSFETs, the SBQWRTT inverter shows a balanced transfer curve and large output/input gain.

SBH is a measure of the mismatch of the energy levels for majority carriers across the metal/semiconductor interface. The Schottky-Mott theory predicts the SBH between a metal with a work function of $\phi_M$ and a semiconductor with an electron affinity of $X_S$ should be $\phi_{bn}=\phi_M-X_S$. This first-order theory ignores the interaction between the metal and the semiconductor. Experimentally observed SBHs in polycrystalline Schottky diodes indicated that SBH does not have a strong dependence on the metal work function. This effect was previously attributed to the presence of a high density of interface states that pin the Fermi level. The Fermi-level pinning mechanism did not suggest the dependence of SBH on the atomic structure of the metal/silicon interface. However, many recent experiments suggest the Fermi level is not pinned and the interface structure plays an important role in the formation of SBH. The best known example is the dependence of the SBH on silicide orientation at the NiSi$_2$—Si (111) interface. Two orientations of NiSi$_2$ can be grown on Si(111): type A, in which the silicide has the same orientation as the substrate, and type B, in which silicide shares the surface normal axis <111> with Si but is rotated 180° about this axis with respect to the Si. The SBH of NiSi$_2$ on n-type Si(111) is 0.65 eV for type A orientation and 0.79 eV for type B orientation. The other example is the SBH of NiSi$_2$/Si(100) junction is 0.4 eV, which is very different from the value of 0.6-0.7 eV usually observed for polycrystalline nickel silicides on n-type Si(100).

Figure 16:
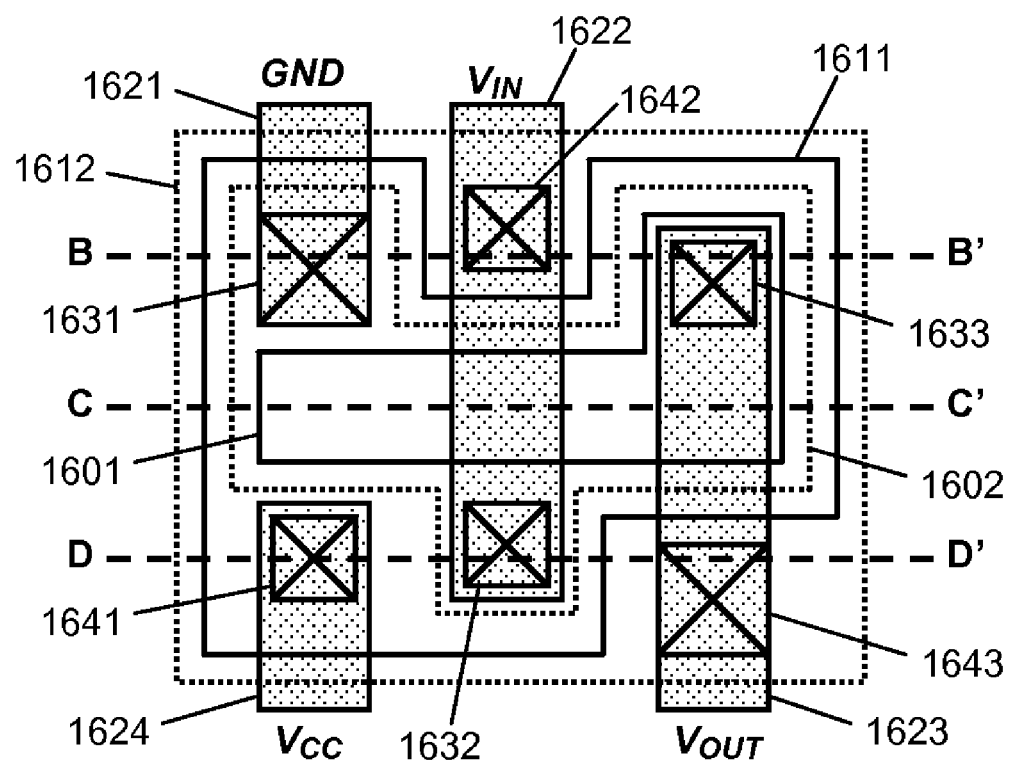
FIG. 16 is a top view layout of an inverter circuit consisting of one n-type SBQWRTT and one p-type SBQWRTT.

FIG. 16 shows an exemplary top-view layout of an inverter circuit consisting of an n-type SBQWRTT and a p-type SBQWRTT. The n-type SBQWRTT is stacked on top of the p-type SBQWRTT to save area. The n-active area 1601 defines the top (i.e. collector) electrode area, and the n-base area 1602 defines the mid and bottom (i.e. base and emitter) electrode areas for the n-type SBQWRTT. The p-active area 1611 defines the top (i.e. emitter) electrode area, and the p-base area 1612 defines the mid and bottom (i.e. base and collector) electrode areas for the p-type SBQWRTT. The n- and p-active areas 1601 and 1611 define the areas of current flow. The p-active area 1611 is larger than the n-active area 1601 to have balanced driving currents between the n- and p-type devices. The inverter's input 1622 connects to the n-type SBQWRTT's base contact 1632 and the p-type SBQWRTT's base contact 1642. The inverter's output 1623 connects to the n-type SBQWRTT's collector contact 1633 and the p-type SBQWRTT's collector contact 1643. The n-type SBQWRTT's emitter contact 1631 connects to ground 1621. The p-type SBQWRTT's emitter contact 1641 connects to $V_{CC}$ 1624.

Figure 17A:
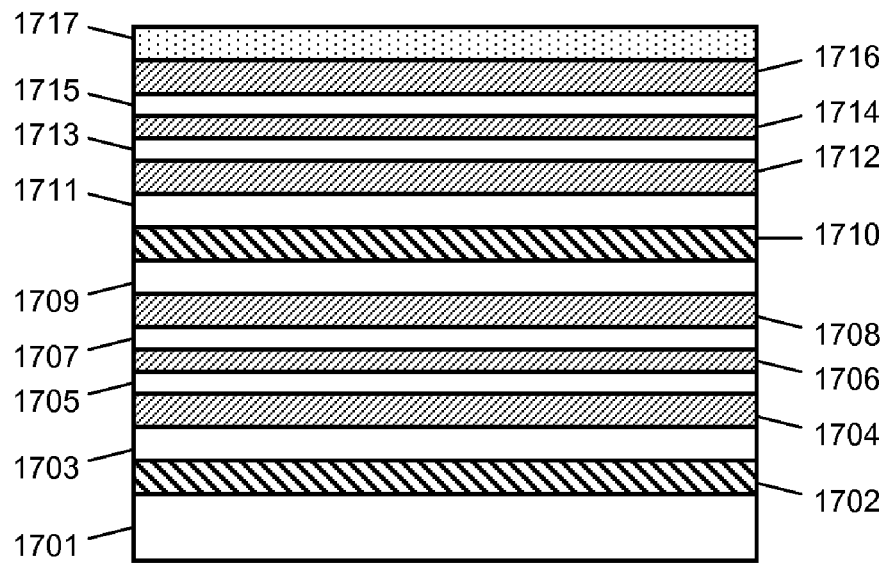
FIG. 17a is a cross-sectional view illustrating the layer structure of the SBQWRTT inverter in FIG. 16 after epitaxial growth and oxide deposition.
Figure 17B:
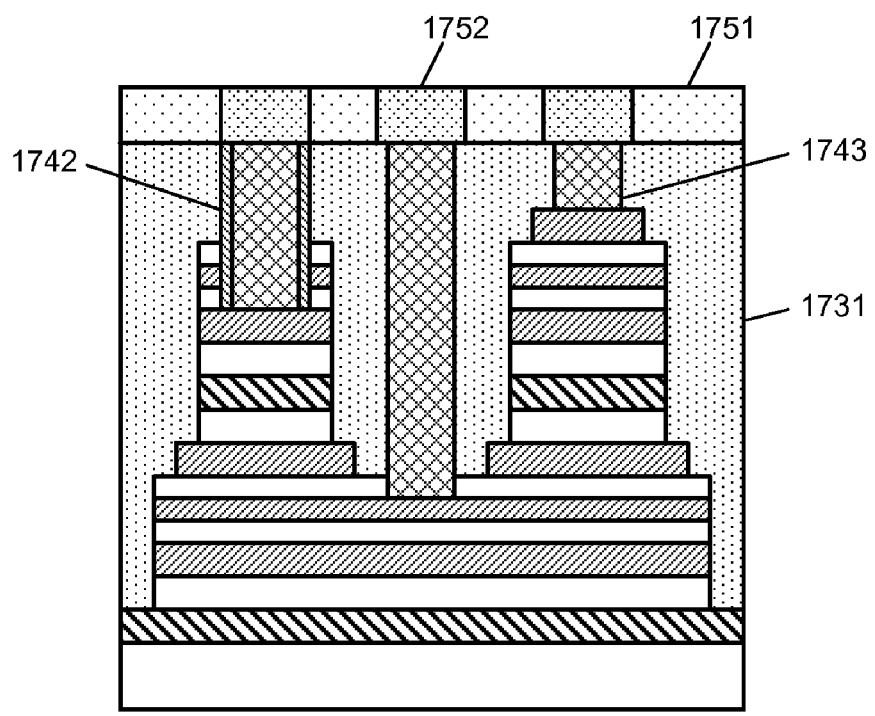
FIG. 17b is a cross-sectional view of the SBQWRTT inverter along the B-B' line in FIG. 16.
Figure 17C:
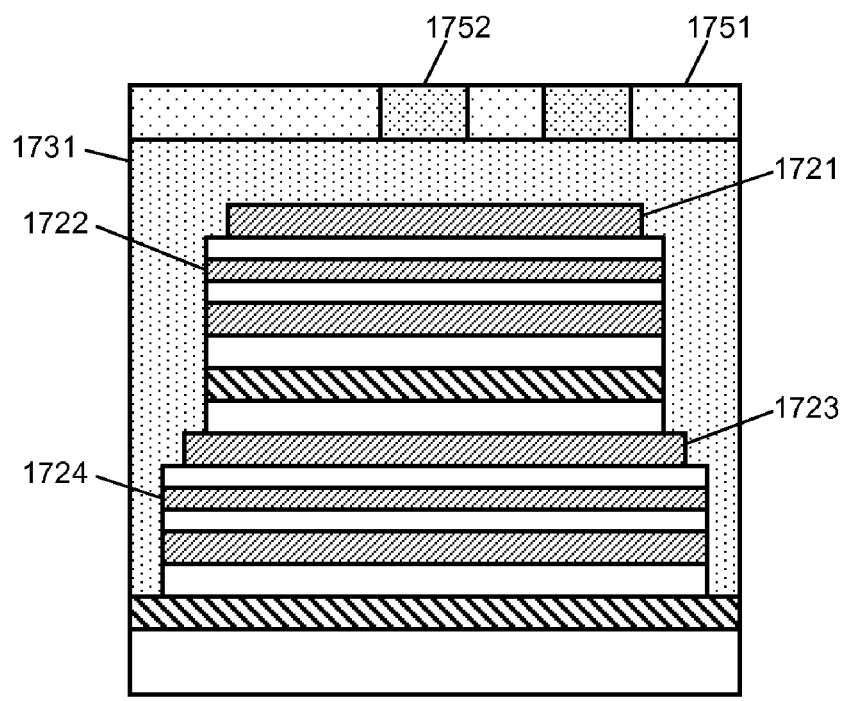
FIG. 17c is a cross-sectional view of the SBQWRTT inverter along the C-C' line in FIG. 16.
Figure 17D:
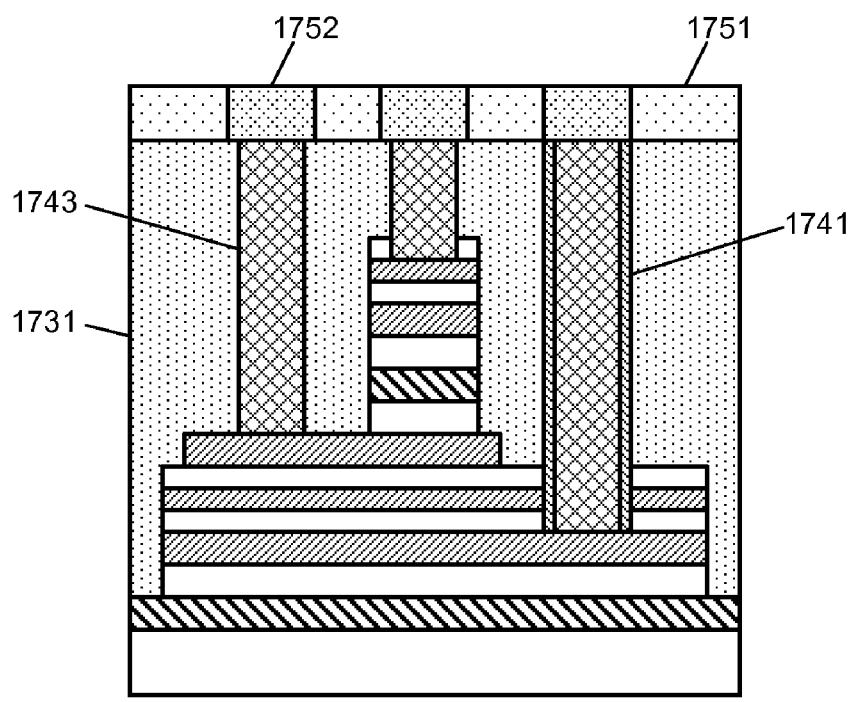
FIG. 17d is a cross-sectional view of the SBQWRTT inverter along the D-D' line in FIG. 16.

An exemplary manufacturing process to fabricate SBQWRTTs is described below. FIG. 17a shows the layer structure after epitaxial growth and oxide deposition. FIGS. 17b-d show the cross-sectional views taken along the B-B', C-C', and D-D' lines in FIG. 16 respectively after the metal-1 step. Surface preparation and film growth is performed in an ultra-high vacuum (UHV) deposition chamber with a base pressure of <4×10$^{-11}$ Torr. The starting material is a Si (001) wafer 1701. The wafer is cleaned through repeated oxidation and etching, followed by the growth of a thin volatile passivation oxide layer. The wafer is then loaded into a deposition chamber through a load-lock chamber. The wafer is heated at 950° C. in UHV for 10 min plus another 10-min Si beam flux at about 780° C., and followed by a brief anneal for about 30 sec at about 900° C. to remove the volatile oxide and impurities from the substrate surface. After oxide removal, a Si buffer layer with a thickness of 100-200 Å is grown by molecular beam epitaxy (MBE) at about 650° C., followed by a brief anneal at about 900° C. to further ensure the cleanliness of the Si surface.

Calcium fluoride is an insulator with a band gap of about 12 eV. CaF$_2$ crystal has a cubic structure that is similar to a diamond structure. Its lattice constant is nearly equal to that of Si (mismatch of 0.6%). CaF$_2$ films of good crystal quality can be grown by MBE on Si surfaces. An epitaxial CaF$_2$ film 1702 with a thickness of about 200-400 Å is grown by electron beam evaporation of ultra-pure CaF$_2$ compound source material onto the wafer kept at about 400-650° C. By evaporation of CaF$_2$ solid source, stoichiometry can be maintained at Ca:F=1:2. The film is then rapid thermal annealed at 600-850° C. to reduce interface charge density. The CaF$_2$ insulating film 1702 provides device isolation between the above device and the substrate below. After CaF$_2$ growth, wafer temperature is lowered to less than 100° C. and a thin Si layer (20-60 Å) is deposited on the wafer. The wafer is heated up to 600° C. to complete solid phase epitaxy (SPE) of the pre-deposited Si layer. Following the SPE process, an epitaxial Si layer is grown by MBE at a substrate temperature of 550-750° C. The total thickness of the Si buffer layer 1703 grown over CaF$_2$ is about 100-200 Å.

NiSi$_2$ and CoSi$_2$ have the cubic lattice structure and close lattice matches with silicon (mismatch of −0.4% for NiSi$_2$ and −1.2% for CoSi$_2$). Single-crystal silicide films of NiSi$_2$ and CoSi$_2$ can be epitaxially grown on Si substrates under UHV conditions by MBE and atomic layer deposition (ALD) with atomically abrupt and structurally perfect interface. These silicide films have good electrical and mechanical properties such as good layer uniformity, high electrical conductivity, and excellent thermal stability. Single-crystal silicon layers can be epitaxially grown on top of the silicide films under UHV conditions by MBE and ALD. Schottky junction of silicon and silicide (NiSi$_2$ and CoSi$_2$) can be used to build heterostructures that operate on the principle of quantum effects. The MSMSM structure of a SBQWRTT can be formed by silicide/Si/silicide/Si/silicide heterostructures and fabricated by using UHV epitaxy technologies.

Single-crystal NiSi$_2$ and CoSi$_2$ have been successfully grown on Si (100) surfaces by using a two-step template method (see Tung, et al, Appl. Phys. Lett. 1983, pp. 888-890) under UHV conditions. The first step is the growth of a template layer under conditions particularly suited for nucleation, and the second step is the growth on top of the template layer under conditions suited for homoepitaxial growth. In this method, a thin epitaxial layer is formed at a lower temperature before subsequent epitaxial growth at a higher temperature. For example, a few monolayers of the metal or the disilicide materials are deposited from separate metal and silicon e-beam sources in a MBE chamber at room temperature. After a short time annealing (1-5 min) at about 400-500° C., the epitaxial silicide layer is used as the template layer for the subsequent silicide growth. A thicker silicide layer of desired thickness is grown on top of the template layer by stoichiometric codeposition of metal and silicon at room temperature or higher and followed by annealing at about 450-800° C.

A CoSi$_2$ film 1704, as the collector of a p-type SBQWRTT, is grown on wafer in a UHV MBE chamber using a two-step growth procedure. First, a template layer about 10 Å thick is grown by stoichiometric co-deposition of Co and Si at room temperature, and annealed in situ under vacuum at 400° C. for 1 min. Following the growth of a thin CoSi$_2$ template, a thicker CoSi$_2$ film is grown by co-deposition of Co and Si at a substrate temperature of 450° C. to a final total thickness of 200-400 Å.

A Si/Ge/Si composite film 1705, as the collector barrier layer of a p-type SBQWRTT, is epitaxially grown on the wafer. The composite film 1705 consists of 2 ML of Si, 14 ML of Ge, and 9 ML of Si, which are sequentially deposited by ALD at a substrate temperature of 200° C. The composite film 1705 is then annealed at 700° C. for 2 min.

ALD is a coating technique based on chemical vapor deposition (CVD). The main difference is that a binary reaction is split into two half-reactions in ALD in order to achieve a precise control over the film thickness. ALD uses sequential reactions to coat substrates with high conformality and precise thickness control at atomic scale. During each dose, the reactants completely saturate the active sites on the substrate, making ALD a self-limiting process inherently capable of achieving precise monolayer growth. For the SBQWRTT device structure, different layers have different requirements of thickness control. The two epitaxial technologies, ALD and MBE, are integrated in the UHV deposition chamber to grow different layers with different thickness requirements.

A CoSi$_2$ film 1706 with a thickness of 2 ML, as the base of a p-type SBQWRTT, is grown on the wafer by ALD at a substrate temperature of 200° C., and annealed at 400° C. for 1 min. A Si/Ge/Si composite layer 1707, as the emitter barrier of a p-type SBQWRTT, is grown on the wafer under the same growth condition as the Si/Ge/Si film 1705. The Si/Ge/Si composite film 1707 consists of 9 ML of Si, 14 ML of Ge, and 2 ML of Si, which are sequentially deposited by ALD. A CoSi$_2$ film 1708, as the emitter of a p-type SBQWRTT, is grown on the wafer under the same growth condition as the CoSi$_2$ film 1704.

A Si buffer layer 1709 is epitaxially grown by MBE on the wafer by using the Si template technique. A thin silicon layer about 25 Å thick is first deposited at room temperature and briefly annealed at about 500° C. for 2 min. This Si layer serves as a template for subsequent growth of a thicker Si layer to ensure the epitaxial orientation of the Si nuclei and overlayer. The silicon overlay is grown by MBE on the Si template layer at a substrate temperature of about 500° C. The total thickness of the Si buffer layer 1709 is about 100-200 Å.

A CaF$_2$ film 1710 is epitaxially grown on the wafer under the same growth condition as the CaF$_2$ film 1702. This CaF$_2$ insulating film 1710 provides device isolation between the n-type SBQWRTT above and the p-type SBQWRTT below.

A Si buffer layer 1711 is epitaxially grown on the wafer under the same growth condition as the Si film 1703. The Si buffer layers 1703, 1709, and 1711 are to improve the uniformity and crystallinity of the layers grown above them.

A NiSi$_2$ film 1712, as the emitter of an n-type SBQWRTT, is grown on the wafer in a UHV MBE chamber using a two-step growth procedure. First, a thin NiSi$_2$ template layer about 25 Å thick is grown by stoichiometric co-deposition of Ni and Si at room temperature, followed by annealing at 500° C. for 2 min to induce the epitaxial growth of NiSi$_2$. Ni and Si are then co-deposited at room temperature onto this template layer to a final total thickness of 200-400 Å with a subsequent high-temperature anneal at 750° C. for 2 min to improve the crystal quality of NiSi$_2$ film.

A Si layer 1713 with a thickness of 19 ML, as the emitter barrier layer of an n-type SBQWRTT, is grown on the wafer by ALD at a substrate temperature of 200° C. and annealed at 700° C. for 2 min. A NiSi$_2$ film 1714 with a thickness of 2 ML, as the base of an n-type SBQWRTT, is deposited on the wafer by ALD at a substrate temperature of 200° C. and annealed at 800° C. for 1 min. A Si layer 1715 with a thickness of 19 ML, as the collector barrier layer of an n-type SBQWRTT, is grown on the wafer under the same growth condition as the Si layer 1713. A NiSi$_2$ film 1716 with a thickness of 200-400 Å, as the collector of an n-type SBQWRTT, is grown on the wafer under the same growth condition as the NiSi$_2$ film 1712. A SiO$_2$ layer 1717 with a thickness of about 500 Å is deposited on the wafer for passivation. The wafer is then removed from the UHV chamber.

In the exemplary layout and process flow, the SBQWRTT has a vertical structure formed by epitaxial growth. The n-type SBQWRTT is stacked on top of the p-type SBQWRTT to save area. Both n- and p-type devices have three silicide electrode layers for the collector, base, and emitter. From top to bottom, the three electrode layers are collector/base/emitter for n-type SBQWRTTs and emitter/base/collector for p-type SBQWRTTs. In digital circuits, the emitters of n-type SBQWRTTs are sometimes connected to ground and the emitters of p-type SBQWRTTs are sometimes connected to $V_{CC}$. To minimize small signal coupling between the two devices, the bottom electrode of an n-type SBQWRTT and top electrode of a p-type SBQWRTT are emitters. It is also possible to insert a ground plane, made of epitaxial silicide, between two emitter layers to further reduce AC coupling.

As shown in FIG. 17c, mesas are formed to provide area for contact landing and device isolation between neighboring devices. The n-active area 1601 defines the n-top electrode mesa 1721. The n-base area 1602 defines the n-base mesa 1722. The p-active area 1611 defines the p-top electrode mesa 1723. The p-base area 1612 defines the p-base mesa 1724. Photolithographic process and high-selectivity wet etch are used in mesa formation. The base areas (1602 and 1612) define not only the areas of base layers (1706 and 1714) but also the areas of bottom electrode layers (1704 and 1712). The semiconductor barrier layers (1707 and 1715) are remained over the base layers (1706 and 1714) during the base mesa formations (1722 and 1724). After the mesa formations (1721-1724), an inter-level dielectric (ILD) layer 1731 of $SiO_2$ is deposited by low-pressure chemical vapor deposition (LPCVD) on the wafer, and processed by chemical mechanical polishing (CMP) to achieve global planarization. The final thickness of ILD layer above the n-top electrode mesa is about 1000 Å.

The contact masks of 1631, 1632, and 1633 define the contact holes to emitter, base, and collector layers respectively of the n-type SBQWRTT. The contact masks of 1641, 1642, and 1643 define the contact holes to emitter, base, and collector layers respectively of the p-type SBQWRTT. The contact to each electrode layer has its own photo mask and contact etch. There are 6 contact masks for 6 electrode layers in total. Silicon nitride sidewall spacers 1741 and 1742 are formed in the contact holes to the bottom electrodes, as shown in FIGS. 17d and 17b respectively, by conformal deposition (such as LPCVD and ALD) of $Si_3N_4$ and anisotropic etch. The sidewall spacers (1741 and 1742) provide self-aligned electrical insulation between contact plugs and the above base electrode layers (1706 and 1714). If the sidewall spacers (1741 and 1742) are not in use, two additional masks will be needed to create mesas for two bottom electrode layers (1704 and 1712), which inevitably increase the transistor sizes. Because the base layers (1706 and 1714) are atomically thin, the base contact holes are opened after opening other emitter/collector contact holes to avoid chemical over-etch and plasma damage to the base layers from other contact etches and photoresist strips. The semiconductor barrier layers (1707 and 1715) are used as etch stop layers in base contact etches. Metal such as tungsten is deposited to fill in the contact hole as contact plug 1743. CMP is then used to remove tungsten on the wafer surface and achieve global planarization. A layer of low-k dielectric material 1751 is deposited. The dielectric layer 1751 is then patterned and etched to create trenches for metal-1. Metal such as copper is deposited and polished to form the metal-1 layer 1752 for interconnection.

The SBQWRTT disclosed in the present application is different from previously described prior-art devices (MBTs and RTTs) in at least the following fundamental aspects:

1. The MBT has no Schottky junction in the MIMIM structure (FIG. 1a), one Schottky junction in the MIMS structure (FIG. 1b), and two Schottky junctions in the SMS structure (FIG. 1c). While the SBQWRTT has four Schottky junctions in the MSMSM structure (FIG. 3).
2. For the MBT with either MIMIM (FIG. 1a) or MIMS (FIG. 1b) structure, the emitter barrier is an insulator. For the MBT with either MIMS (FIG. 1b) or SMS (FIG. 1c) structure, the collector region is not atomically thin. The collector region is heavily doped near the collector electrode. The contact to the collector region is an ohmic contact. While the SBQWRTT has two semiconductor barriers, i.e. emitter barrier region 32 and collector barrier region 34. The two barriers are atomically thin (less than 100 Å, or preferably less than 50 Å) and typically undoped to minimize statistical dopant fluctuation and impurity scattering.
3. The MBT with either MIMIM (FIG. 1a) or MIMS (FIG. 1b) structure allows current to flow through its insulating barrier, creating a reliability issue due to hot carrier injection. While the SBQWRTT has no insulator in its current path.
4. The MBT does not operate in the principle of resonant tunneling. The device is typically biased so that the injected electrons have energies much above the Fermi level in the base. Since the discrete energy levels in the base are closer at a higher energy, the injected hot electrons almost have continuous energy levels. On the other hand, the SBQWRTT typically has only one energy state in the quantum well due to the very small base width. The driving current is enhanced by resonant tunneling as injected electrons having energies close to the first discrete energy level in the quantum well.

Although SBQWRTT and conventional RTT have a double-barrier quantum-well structure, they have the following fundamental differences in device structures and operation mechanisms.

1. The quantum well region is a semiconductor for a RTT, while the quantum well region is a metal or silicide for a SBQWRTT.
2. The RTT has no Schottky junctions, while the SBQWRTT has four Schottky junctions in its MSMSM structure.
3. The RTT is mainly used in circuit applications such as oscillators because of its negative differential resistance. The device is typically biased between the peak and valley points. For most circuit applications, negative differential resistance could cause unwanted oscillation and driving current reduction. On the other hand, the SBQWRTT, as a general-purpose transistor, is typically biased below the peak point to avoid the unwanted negative differential resistance.
4. The RTT typically has multiple energy levels in the quantum well, so the I-V characteristics show multiple peaks. On the other hand, the SBQWRTT typically has a single energy state in the quantum well. The I-V characteristics of a SBQWRTT are similar to those of conventional transistors such as BJTs and MOSFETs without multiple peaks.

While the invention has been described with reference to specific embodiments, the description is illustrative of the invention and is not to be considered as limiting the invention. Various modifications and applications may occur for those skilled in the art without departing from the true spirit and scope of the invention as defined by the appended claims.

Figure 18:
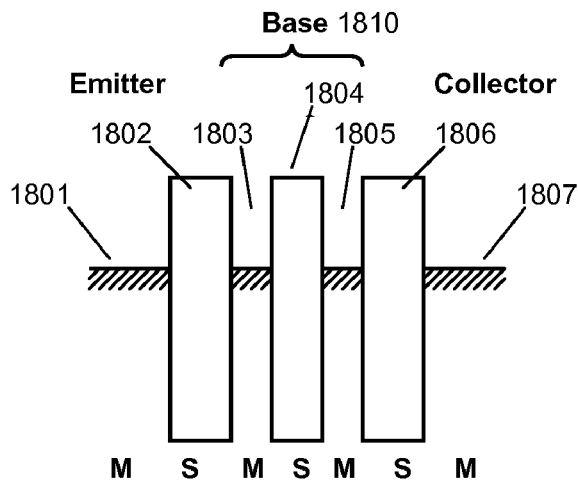
FIG. 18 is a band diagram of an n-type SBQWRTT with a superlattice base structure.

One example of the variations is shown in FIG. 18, in which the base region 1810 is a superlattice structure of metal and semiconductor. By traditional definition, superlattice is a periodic structure consisting of thin alternating layers of narrower band gap semiconductor and wider band gap semiconductor. Superlattice has a broader meaning in the present invention. It can be a periodic structure consisting of alternating layers of metal (or silicide) and semiconductor. In FIG. 18, the base region 1810 consists of the first metal base region 1803, a semiconductor base barrier region 1804, and the second metal base region 1805. $W_S$ is the thickness of the semiconductor base barrier region 1804, and $W_B$ is the thickness of the metal base regions 1803 and 1805 (assuming the two metal base layers have the same thickness). At least one of the metal base regions 1803 and 1805 is connected to the base terminal 37. Other than the base region, superlattice can also be used in the emitter and collector regions.

Figure 19A:
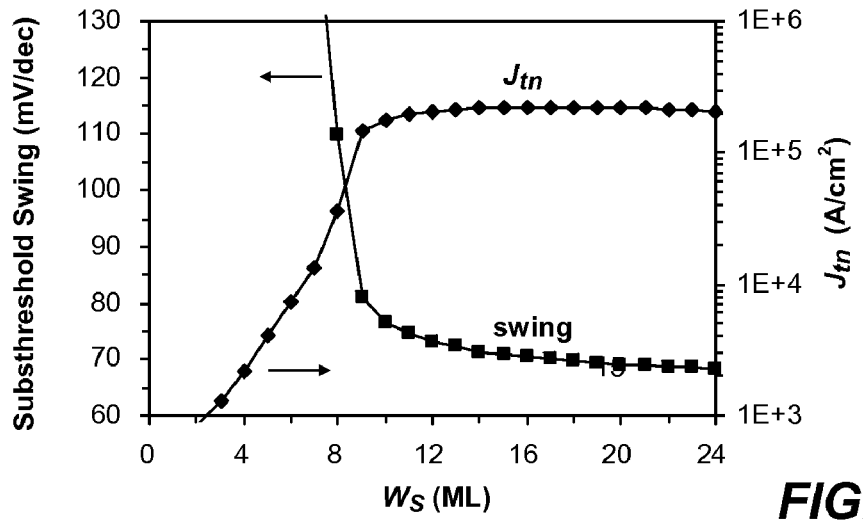
FIG. 19a shows subthreshold swing and electron tunneling current $J_{tn}$ versus $W_S$ for an n-type SBQWRTT with a superlattice base structure.

FIG. 19a shows subthreshold swing (between $V_B$=0 and 0.2 V) and on-state electron tunneling current $J_{tn}$ (at $V_B$=0.2 V) versus $W_S$ for an n-type SBQWRTT having a superlattice base. Un-doped (100) Si is used in the emitter barrier region 1802, semiconductor base barrier region 1804, and collector barrier region 1806. (100) NiSi$_2$ is used in the emitter region 1801, metal base regions 1803 and 1805, and collector region 1807. SBH q$\phi_{bn}$=0.4 eV between (100) NiSi$_2$ and (100) Si. $W_{EB}$=$W_{CB}$=19 ML. $W_B$=2 ML. $V_E$=0 V and $V_C$=0.2 V. When $W_S$ is larger than 10 ML, $J_{tn}$ and subthreshold swing are almost independent of $W_S$. When $W_S$ is smaller than 10 ML, the subthreshold swing increases rapidly with decreasing $W_S$ and $J_{tn}$ decreases rapidly with decreasing $W_S$. When $W_S$ is reduced to zero, $W_B$ becomes doubled and $E_1$ becomes smaller. $J_{tn}$ and subthreshold swing are degraded due to the NDR effect occurs at smaller $E_1$.

Figure 19B:
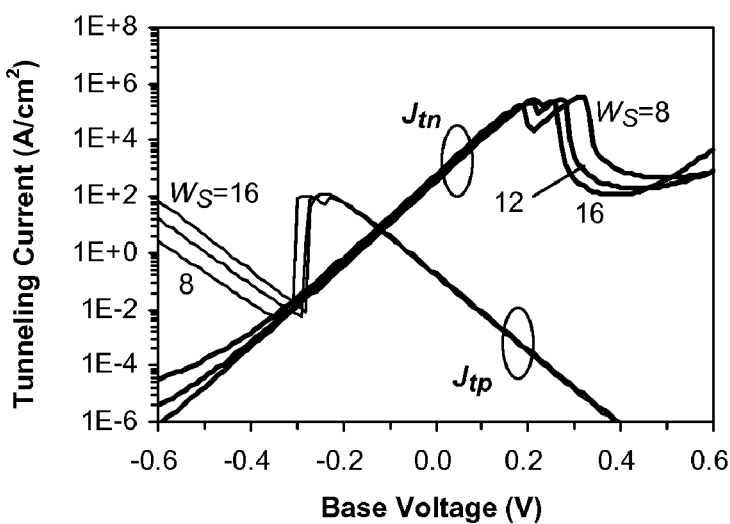
FIG. 19b shows electron and hole tunneling currents, $J_{tn}$ and $J_{tp}$, for an n-type SBQWRTT as functions of $V_B$ for $W_S=8$, 12, and 16 ML.

FIG. 19b shows the electron and hole tunneling currents, $J_{tn}$ and $J_{tp}$, as functions of $V_B$ for an n-type SBQWRTT having a superlattice base. NDR occurs at a smaller $V_B$ for a smaller $W_S$. The peak-to-valley ratio increases as $W_S$ is reduced. The subthreshold swing is almost independent of $W_S$ if $V_B$ is small enough before NDR occurs. $J_{tn}$ is more than 3 orders of magnitude larger than $J_{tp}$ at $V_B$=0 V.

What is claimed is:

1. A semiconductor transistor device, comprising:
   a) one or more conductive base regions connected to a first electrical terminal;
   b) a first semiconductor barrier region in contact with the one or more conductive base regions, wherein a first Schottky barrier junction is formed at the interface of the first semiconductor barrier region and the one or more conductive base regions;
   c) a second semiconductor barrier region in contact with the one or more conductive base regions, wherein a second Schottky barrier junction is formed at the interface of the second semiconductor barrier region and the one or more conductive base regions;
   d) a conductive emitter region in contact with the first semiconductor barrier region, wherein a third Schottky barrier junction is formed at the interface of the conductive emitter region and the first semiconductor barrier region, wherein the conductive emitter region is connected to a second electrical terminal; and
   e) a conductive collector region in contact with the second semiconductor barrier region, wherein a fourth Schottky barrier junction is formed at the interface of the conductive collector region and the second semiconductor barrier region, wherein the conductive collector region is connected to a third electrical terminal,
   wherein at least one of the first semiconductor barrier region or the second semiconductor barrier region comprises a dimension smaller than 100 Å.

2. The semiconductor transistor device of claim 1, wherein the first semiconductor barrier region comprises a first layer sandwiched between the one or more conductive base regions and the conductive emitter region, wherein the first layer is thinner than 100 Å.

3. The semiconductor transistor device of claim 2, wherein the first layer comprises silicon, wherein the first layer is parallel to a (100) or (110) crystal plane.

4. The semiconductor transistor device of claim 1, wherein the second semiconductor barrier region comprises a second layer sandwiched between the one or more conductive base regions and the conductive collector region, wherein the second layer is thinner than 100 Å.

5. The semiconductor transistor device of claim 1, wherein the first semiconductor barrier region or the second semiconductor barrier region comprises a semiconductors material selected from the group consisting of silicon, germanium, and III-V compound semiconductors.

6. The semiconductor transistor device of claim 1, wherein at least one of the first semiconductor barrier region or the second semiconductor barrier region has a layered structure having a thinness thinner than 50 Å.

7. The semiconductor transistor device of claim 1, wherein a quantum well is formed in the one or more conductive base regions between barriers provided by the first semiconductor barrier region and the second semiconductor barrier region.

8. The semiconductor transistor device of claim 1, wherein the one or more conductive base regions are configured to produce a tunneling current through the first semiconductor barrier region and the second semiconductor barrier region in response to a voltage applied to the one or more conductive base regions.

9. The semiconductor transistor device of claim 8, wherein the work function in the one or more conductive base regions is closer to the conduction band edge than to the valence band edge in at least one of the first semiconductor barrier region or the second semiconductor barrier region, wherein the tunnel current has electrons as majority carriers.

10. The semiconductor transistor device of claim 9, wherein the voltage applied to the base is positive relative to the emitter voltage.

11. The semiconductor transistor device of claim 9, wherein the one or more conductive base regions comprise a layer of NiSi$_2$ thinner than 20 Å.

12. The semiconductor transistor device of claim 11, wherein the layer of NiSi$_2$ is parallel to (100) crystal plane.

13. The semiconductor transistor device of claim 8, wherein the work function in the one or more conductive base regions is closer to the valence band edge than to the conduction band edge in at least one of the first semiconductor barrier region or the second semiconductor barrier region, wherein the tunneling current has holes as majority carriers.

14. The semiconductor transistor device of claim 13, wherein the voltage applied to the one or more conductive base regions is negative relative to the emitter voltage.

15. The semiconductor transistor device of claim 13, wherein the one or more conductive base regions comprise a layer of CoSi$_2$ thinner than 20 Å.

16. The semiconductor transistor device of claim 15, wherein the layer of CoSi$_2$ is parallel to (100) crystal plane.

17. The semiconductor transistor device of claim 1, wherein at least one of the first semiconductor barrier region or the second semiconductor barrier region is substantially undoped.

18. The semiconductor transistor device of claim 1, wherein the conductive emitter region, the one or more conductive base regions, or the conductive collector region comprises one or more of a metal, a silicide compound, a germanide compound, or a metallic compound.

19. The semiconductor transistor device of claim 1, wherein at least one of the first semiconductor barrier region or the second semiconductor barrier region comprises a Si/Ge heterojunction structure.

20. The semiconductor transistor device of claim 19, wherein the Si/Ge heterojunction structure has a combined thickness smaller than 60 Å.

21. The semiconductor transistor device of claim 1, wherein the one or more conductive base regions comprises:
    a) a first conductive base region in contact with the first semiconductor barrier region;
    b) a semiconductor base barrier region in contact with the first conductive base region; and
    c) a second conductive base region in contact with the second semiconductor barrier region.

22. A semiconductor transistor device, comprising:
    a) one or more conductive base regions;
    b) a first semiconductor barrier region in contact with the one or more conductive base regions, wherein a first Schottky barrier junction is formed at the interface of the first semiconductor barrier region and the one or more conductive base regions;
    c) a second semiconductor barrier region in contact with the one or more conductive base regions, wherein a second Schottky barrier junction is formed at the interface of the second semiconductor barrier region and the one or more conductive base regions;
    d) a conductive emitter region in contact with the first semiconductor barrier region, wherein a third Schottky barrier junction is formed at the interface of the conductive emitter region and the first semiconductor barrier region; and
    e) a conductive collector region in contact with the second semiconductor barrier region, wherein a fourth Schottky barrier junction is formed at the interface of the conductive collector region and the second semiconductor barrier region,
wherein the one or more conductive base regions is configured to produce a tunneling current through the first semiconductor barrier region and the second semiconductor barrier region in response to a voltage applied to the one or more conductive base regions.

23. The semiconductor transistor device of claim 22, wherein a quantum well is formed in the one or more conductive base regions between barriers provided by the first semiconductor barrier region and the second semiconductor barrier region.

24. The semiconductor transistor device of claim 22, wherein at least one of the first semiconductor barrier region or the second semiconductor barrier region comprises a dimension smaller than 100 Å.

25. A semiconductor transistor device, comprising:
    a) one or more conductive base regions;
    b) a first semiconductor barrier region in contact with the one or more conductive base regions, wherein a first Schottky barrier junction is formed at the interface of the first semiconductor barrier region and the one or more conductive base regions;
    c) a second semiconductor barrier region in contact with the one or more conductive base regions, wherein a second Schottky barrier junction is formed at the interface of the second semiconductor barrier region and the one or more conductive base regions;
    d) a conductive emitter region in contact with the first semiconductor barrier region, wherein a third Schottky barrier junction is formed at the interface of the conductive emitter region and the first semiconductor barrier region; and
    e) a conductive collector region in contact with the second semiconductor barrier region, wherein a fourth Schottky barrier junction is formed at the interface of the conductive collector region and the second semiconductor barrier region,
    wherein the conductive emitter region, the one or more conductive base regions, or the conductive collector region comprises one or more of a metal, a silicide compound, a germanide compound, or a metallic compound,
    wherein the first semiconductor barrier region comprises a first layer sandwiched between the one or more conductive base regions and the conductive emitter region,
    wherein the second semiconductor barrier region comprises a second layer sandwiched between the one or more conductive base regions and the conductive collector region,
    wherein the first layer and the second layer are thinner than 50 Å,
    wherein the first layer or the second layer comprises silicon,
    wherein the first layer is parallel to a (100) or (110) crystal plane,
    wherein a quantum well is formed in the one or more conductive base regions between barriers provided by the first semiconductor barrier region and the second semiconductor barrier region,
    wherein the one or more conductive base regions are configured to produce a tunneling current through the first semiconductor barrier region and the second semiconductor barrier region in response to a voltage applied to the one or more conductive base regions.

* * * * *